(12) United States Patent
Seo et al.

(10) Patent No.: US 9,583,890 B2
(45) Date of Patent: Feb. 28, 2017

(54) RJ45 CONNECTOR

(71) Applicant: Optical Cable Corporation, Roanoke, VA (US)

(72) Inventors: Sumio Seo, Wallingford, VT (US); John Michael Ray, Franklinton, NC (US); Derrick F. Stikeleather, Black Mountain, NC (US); Ian J. Timmins, Asheville, NC (US); Nicholas Uhland, Asheville, NC (US)

(73) Assignee: Optical Cable Corporation, Roanoke, VA (US)

( * ) Notice: Subject to any disclaimer, the term of this patent is extended or adjusted under 35 U.S.C. 154(b) by 0 days.

(21) Appl. No.: 15/082,630

(22) Filed: Mar. 28, 2016

(65) Prior Publication Data

US 2017/0025795 A1    Jan. 26, 2017

Related U.S. Application Data

(63) Continuation-in-part of application No. 14/598,793, filed on Jan. 16, 2015, now Pat. No. 9,300,092.
(Continued)

(51) Int. Cl.
*H01R 12/00* (2006.01)
*H01R 13/66* (2006.01)

(52) U.S. Cl.
CPC .................................. *H01R 13/66* (2013.01)

(58) Field of Classification Search
CPC ................. H05K 1/0216; H05K 1/023; H05K 2201/10689; H01R 13/645; H01R 13/658; H01R 13/6463; H01R 13/518
(Continued)

(56) References Cited

U.S. PATENT DOCUMENTS 5,299,956 A    4/1994 Brownell et al.
5,310,363 A    5/1994 Brownell et al.
(Continued)

OTHER PUBLICATIONS

International Search Report and the Written Opinion of the International Searching Authority; Jan. 6, 2016; PCT Application No. PCT/US2015-051680.

*Primary Examiner* — Jean F Duverne
(74) *Attorney, Agent, or Firm* — The Van Winkle Law Firm; William G. Heedy; David M. Carter

(57) ABSTRACT

There is provided a communication connector for improving signal transmission performance, the communication connector including a cable termination component being sized and configured for selective receipt of a plurality of conductor pairs of a cable; a plurality of slots on said cable termination component, wherein each wire of each of the plurality of conductor pairs may be selectively pressed into one of the plurality of slots; a receptacle component including a plurality of electrical contacts and a plurality of offset-positioned insulation displacement contacts (IDCs), each of the plurality of offset-positioned IDCs being aligned for engaged abutment with a corresponding one of the wires of the plurality of conductor pairs when the cable termination component and the receptacle component are coupled; a printed circuit board; and wherein the offset placement of the IDCs increases the separation distance between IDCs of another receptacle component when a plurality of the receptacle components are adjacent to one another, whereby a signal transmission is improved.

20 Claims, 27 Drawing Sheets

Related U.S. Application Data

(60) Provisional application No. 62/057,443, filed on Sep. 30, 2014, provisional application No. 62/168,099, filed on May 29, 2015.

(58) Field of Classification Search
USPC .......................................................... 439/76.1
See application file for complete search history.

(56) References Cited

U.S. PATENT DOCUMENTS

| | | |
|---|---|---|
| 6,287,149 B1 | 9/2001 | Elkhatib et al. |
| 6,808,399 B2 | 10/2004 | Rothermel et al. |
| 7,102,463 B2 | 9/2006 | Clark |
| 8,120,927 B2 | 2/2012 | Chen et al. |
| 8,287,316 B2 * | 10/2012 | Pepe ........................ H01R 13/02 439/676 |
| 8,298,922 B2 | 10/2012 | Schumann et al. |
| 9,300,092 B1 * | 3/2016 | Ray .................... H01R 13/6466 |
| 2009/0269978 A1 | 10/2009 | Pete et al. |
| 2011/0300740 A1 | 12/2011 | Schumann et al. |
| 2012/0111623 A1 | 5/2012 | Chen et al. |
| 2014/0154895 A1 | 6/2014 | Poulsen et al. |
| 2014/0203886 A1 | 7/2014 | Schumacher |
| 2014/0206240 A1 | 7/2014 | Schumacher et al. |

\* cited by examiner

RJ45 CONNECTOR

RELATED APPLICATION

This application is a Continuation-in-Part application of U.S. Non-Provisional patent application Ser. No. 14/598,793 filed on Jan. 16, 2015, which claims priority to and incorporates entirely by reference U.S. Provisional Patent Application Ser. No. 62/057,443 filed on Sep. 30, 2014, and further claims priority to and incorporates entirely by reference U.S. Provisional Patent Application Ser. No. 62/168,099 filed on May 29, 2015.

BACKGROUND OF THE INVENTION

This invention relates to reducing electrical signal interference and return loss which arises due to parallel contacts in electrical connectors. More particularly, it relates to reducing return loss and pair to pair as well as common mode cross talk interference in FCC type plugs. The Federal Communications Commission has adopted certain architectural standards with respect to electrical connectors utilized in the telecommunications industry so as to provide intermatability. The connectors most commonly utilized are FCC type modular plugs and jacks, also referred to as RJ45 plugs and jacks. The plug is commonly terminated to a plurality of conductors which may be connected to a communication device. Normally, each plug is terminated to eight conductors which form four pairs. The corresponding jack is commonly mounted to a panel or a printed circuit board or a wall outlet, which in turn is connected to the telecommunication network. To complete the circuit, the plug and jack are intermated.

While most of the cross talk and return loss problems arise in the plug, normally the reduction of cross talk and return loss is dealt with in the jack. For example, U.S. Pat. No. 5,299,956 assigned to Optical Cable Corporation, assignee of this application, shows a jack connected to a circuit board in which traces on the board are used to cancel cross talk which primarily arises in a corresponding plug. U.S. Pat. No. 5,310,363, also assigned to Optical Cable Corporation, shows a similar jack having both cross talk cancellation and return loss reduction features.

Industry standards for maximum cross talk, both near end cross talk (NEXT) and far end cross talk (FEXT), common mode coupling, and maximum return loss are governed by the Telecommunications Industry Association (TIA). The TIA is currently addressing performance standards at the so-called Category 8 level, which is in a bandwidth of up to 2,000 MHz and designed to enable data transmission rates up to 40 Gbits per second. The TIA standards are pair and frequency dependent. The TIA standards as currently drafted for NEXT, FEXT and return loss for various frequencies and pairs are shown in the graphs illustrated in FIGS. 6 through 14.

Moreover, cable termination in a jack presently includes an arduous process requiring usage of tools such as punch down tools and pliers to electrically connect and hold together the insulation displacement contacts (IDCs) on the jack with the corresponding connector pairs of a cable. Therefore, a tool-less mechanism for termination of cables in a jack is desirable in the art.

SUMMARY OF THE INVENTION

In accordance with one form of this invention, there is provided a communication connector for improving signal transmission performance, the communication connector including a cable termination component having a front end and a rear end, the cable termination component being sized and configured for selective receipt of a plurality of conductor pairs of a cable; a plurality of slots on said cable termination component, wherein each wire of each of the plurality of conductor pairs may be selectively pressed into one of the plurality of slots; a receptacle component including a plurality of electrical contacts and a plurality of offset-positioned insulation displacement contacts (IDCs), each of the plurality of offset-positioned IDCs being aligned for engaged abutment with a corresponding one of the wires of the plurality of conductor pairs when the cable termination component and the receptacle component are coupled; a printed circuit board; a first lever arm having a distal end and a proximal end that is pivotally secured to the cable termination component, said proximal end having a hook element that is sized and configured for engaging a corresponding latch element on the receptacle component, and the first lever arm being selectively operable between an open position and a closed position, wherein force exerted by a user on the distal end of the first lever arm when in the open position causes the hook element to engage the corresponding latch element, thereby defining the closed position, and securing the cable termination component to the receptacle component; and wherein the offset placement of the IDCs increases the separation distance between IDCs of another receptacle component when a plurality of the receptacle components are adjacent to one another, whereby a signal transmission is improved.

In accordance with another form of this invention, there is provided a communication connector for improving signal transmission performance, the communication connector including a housing; a cable termination component received by the housing, and the cable termination component being sized and configured for selective receipt of a plurality of conductor pairs of a cable; a plurality of slots, wherein each wire of each of the plurality of conductor pairs may be selectively pressed into one of the plurality of slots; a receptacle component received by the housing including a plurality of electrical contacts and a plurality of offset-positioned insulation displacement contacts (IDCs), each of the plurality of offset-positioned IDCs being aligned for engaged abutment with a corresponding one of the wires of the plurality of conductor pairs when the cable termination component and the receptacle component are coupled; a printed circuit board; and wherein the offset placement of the IDCs increases the separation distance between IDCs of another receptacle component when a plurality of the receptacle components are adjacent to one another, whereby a signal transmission is improved.

In accordance with another form of this invention, there is provided an electrical connectivity system for improving signal transmission performance, the electrical connectivity system including a plug; a jack configured for receipt of the plug, the jack including a cable termination component having a front end and a rear end, the cable termination component being sized and configured for selective receipt of a plurality of conductor pairs of a cable; a plurality of slots on the cable termination component, wherein each wire of each of the plurality of conductor pairs may be selectively pressed into one of the plurality of slots; a receptacle component including a plurality of electrical contacts and a plurality of offset-positioned insulation displacement contacts (IDCs) on the receptacle component, each of the plurality of offset-positioned IDCs being aligned for engaged abutment with a corresponding one of the wires of the plurality of conductor pairs when the cable termination component and the receptacle component are coupled; a printed circuit board; and a first lever arm having a distal end and a proximal end that is pivotally secured to the cable termination component, the proximal end having a hook element that is sized and configured for engaging a corresponding latch element on the receptacle component, and the first lever arm being selectively operable between an open position and a closed position, wherein force exerted by a user on the distal end of the first lever arm when in the open position causes the hook element to engage the corresponding latch element, thereby defining the closed position, and securing the cable termination component to the receptacle component; and wherein the offset placement of the IDCs increases the separation distance between IDCs of another receptacle component when a plurality of the jacks are adjacent to one another, whereby a signal transmission is improved.

BRIEF DESCRIPTION OF THE DRAWINGS

The subject matter which is regarded as the invention is set forth in the appended claims. The invention itself together with further objects and advantages may be better understood in reference to the following description taken in conjunction with the accompanying drawings in which:

Like reference numerals refer to like parts throughout the several views of the drawings.

DESCRIPTION OF THE PREFERRED EMBODIMENT

Figure 1:
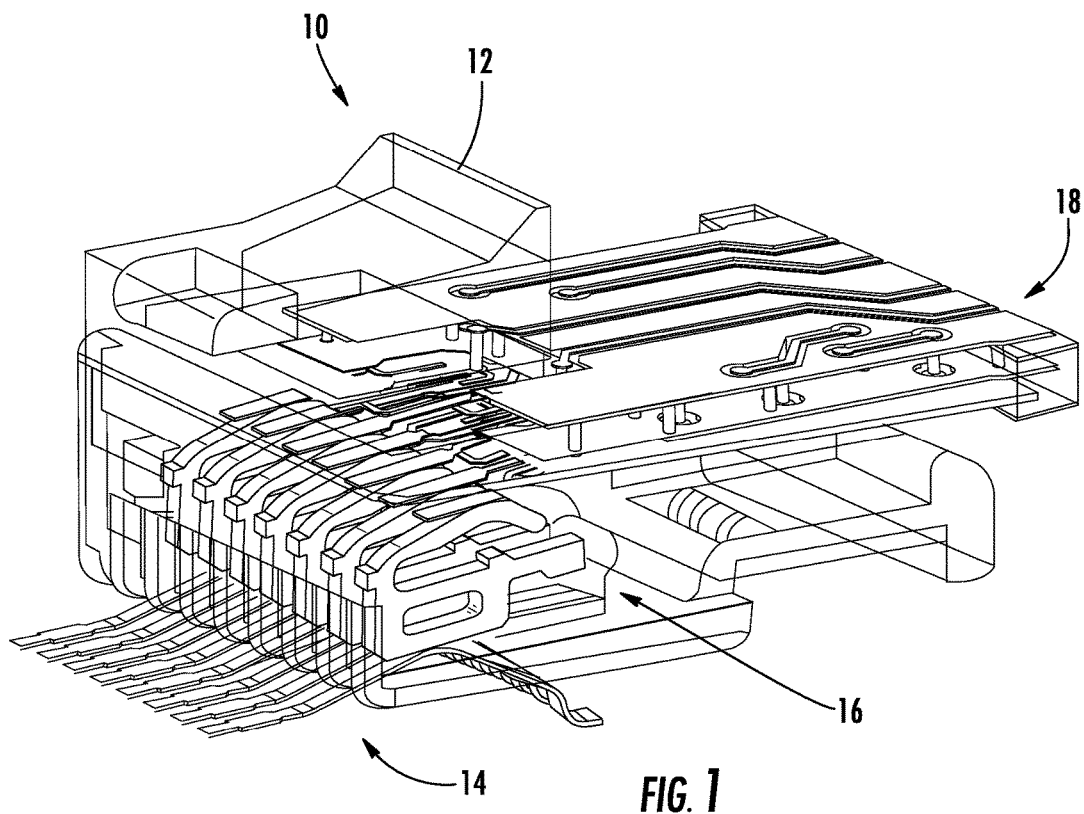
FIG. 1 is a cut-away partial pictorial view of the plug of the subject invention showing a circuit board and plug contacts interfacing with corresponding jack contacts.

Referring now more particularly to FIG. 1, there is provided plug 10 having plastic body 12. Preferably, plug 10 has the connection architecture of a standard FCC RJ45 plug for connecting four signal pairs of conductors to a corresponding RJ45 jack, which except for jack contacts 14, is particularly illustrated in FIGS. 21-33. Plug 10 includes eight contacts 16 which are ordered in pairs in accordance with FCC standards. According to the FCC standards, pair 1 consists of the fourth and fifth contacts, pair 2 consists of the first and second contacts, pair 3 consists of the third and sixth contacts, and pair 4 consists of the seventh and eighth contacts.

Figure 3:
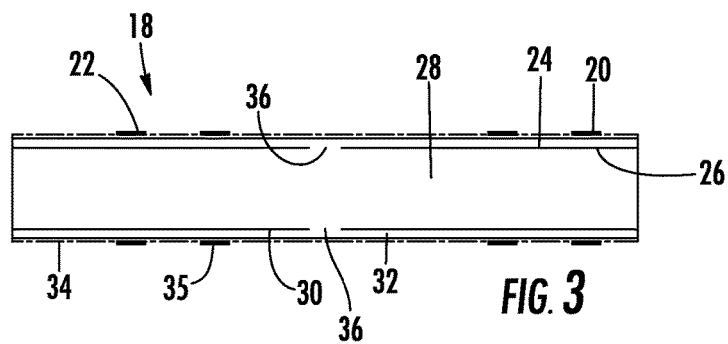
FIG. 3 is an inverted sectional view of the circuit board of FIG. 2 taken through section lines 3-3.
Figure 5:
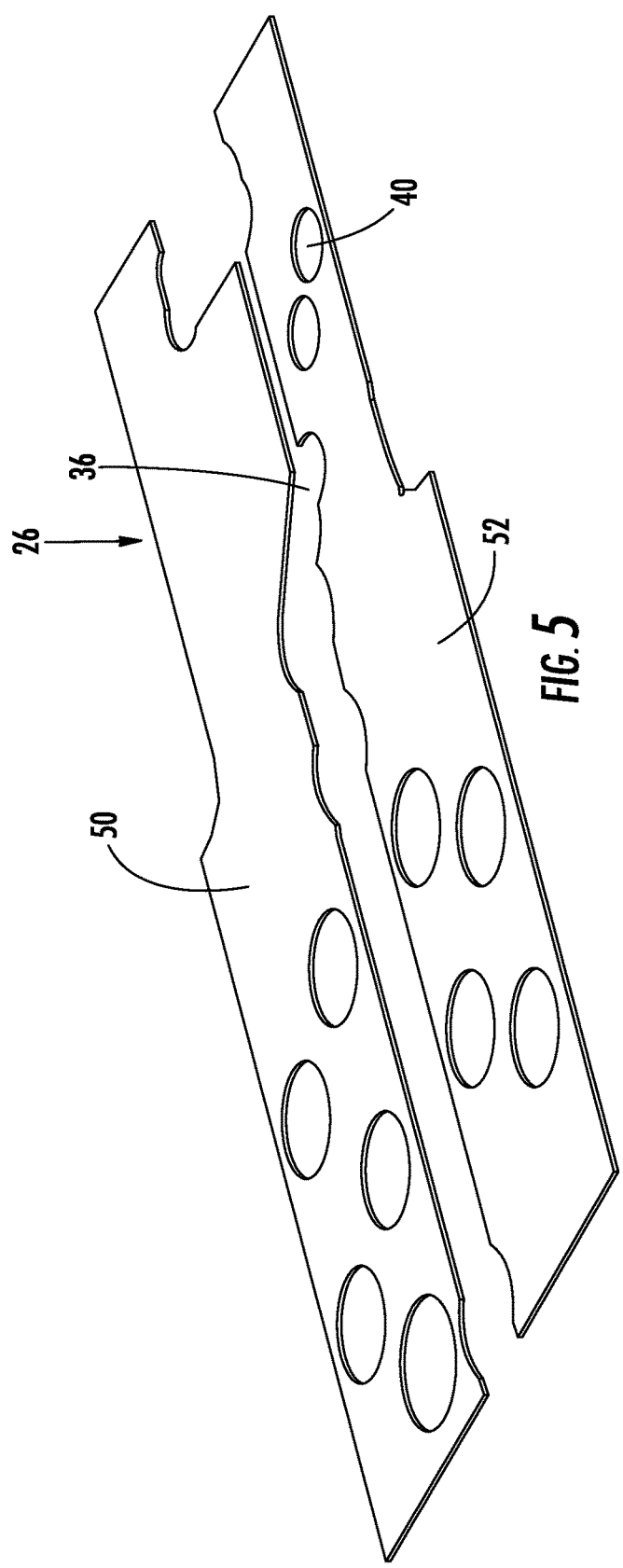
FIG. 5 is a pictorial view of one of the split ground planes of FIG. 4.
Figure 6:
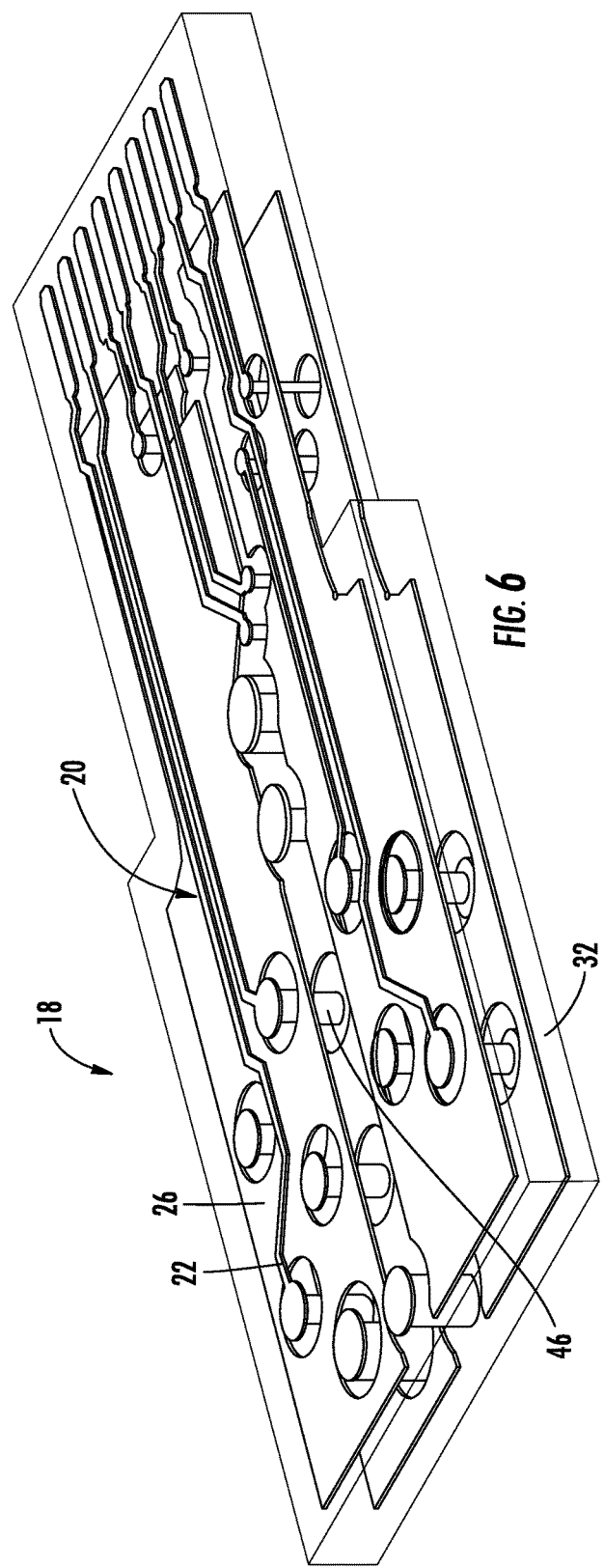
FIG. 6 is a more detailed pictorial view of the circuit board of FIG. 4.

Plug 10 also includes circuit board 18. Circuit board 18 preferably consists of seven layers of conductors and dielectric materials which is better illustrated in FIG. 3 which shows an inverted cross-section of circuit board 18. The top layer 20 of circuit board 18 includes circuit board traces corresponding to two of the four conductor pairs of traces, such as trace 22. The second layer 24 of the board 18 includes a high performance, high frequency dielectric material such as FR408 which is commercially available from Isola Laminate Systems Corp. The third layer 26 of circuit board 18 consists of a first split ground plane 26, which is also shown in FIG. 5. The fourth layer 28 of circuit board 18 consists of standard dielectric material such as FR4 also commercially available from Isola Laminate Systems Corp. The fifth layer 30 of circuit board 18 consists of a second split ground plane 30. The sixth layer 32 of circuit board 18 preferably consists of the same high performance, high frequency dielectric as second layer 24. The seventh or bottom layer 34 includes another layer of circuit board traces corresponding to the other two of the four conductor pairs of traces, such as trace 35.

As can be seen best in FIG. 5, first ground plane 26 is split forming a gap 36 extending lengthwise along the ground plane in the direction of the pairs of traces so as to effectively divide ground plane 26 into two electrically isolated elements 50 and 52. The position of the split relative to the traces affects electrical performance. Second ground plane 30 is also split and is preferably substantially identical to first ground plane 26. The traces on the top side and bottom side of circuit board 18 are terminated to circuit board contacts 38 which extend from one side of circuit board 18. For reference, the side of circuit board 18 from which the circuit board contacts 38 extend is referred to as the top side. A plurality of via holes, such as via hole 40, extend through the circuit board 18 so that a trace on the bottom side of the board can be connected to a corresponding circuit board contact. For example, trace 35 is connected to conductor 46 which extends through a via hole (not shown so conductor 46 and its connections are clear) which in turn connects to circuit board contact 48. The eight circuit board contacts 38 are connected to eight corresponding plug contacts 16.

Figure 2:
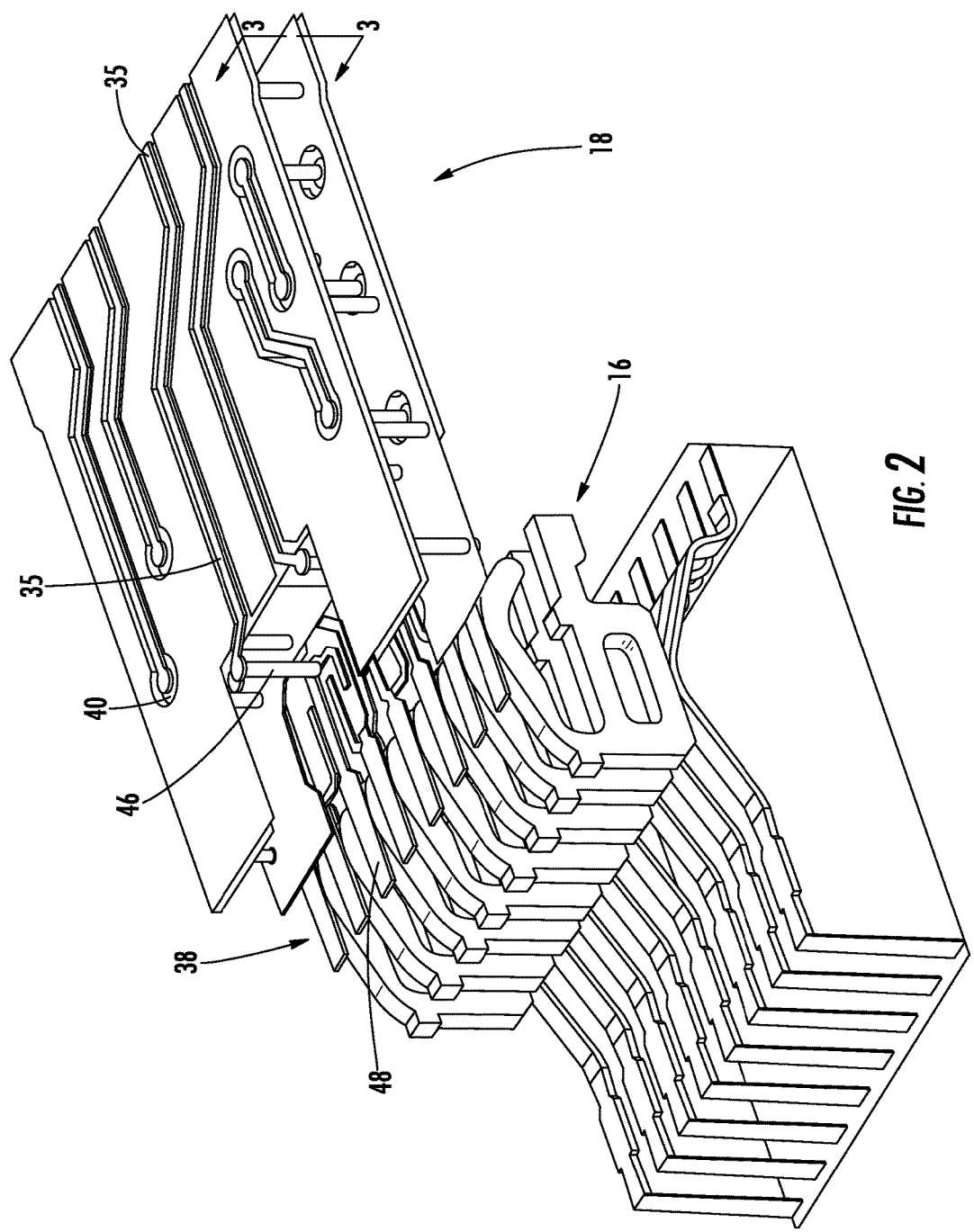
FIG. 2 is a partial pictorial view of the plug of FIG. 1 with the plug body and plastic components having been removed for exemplification purposes.
Figure 4:
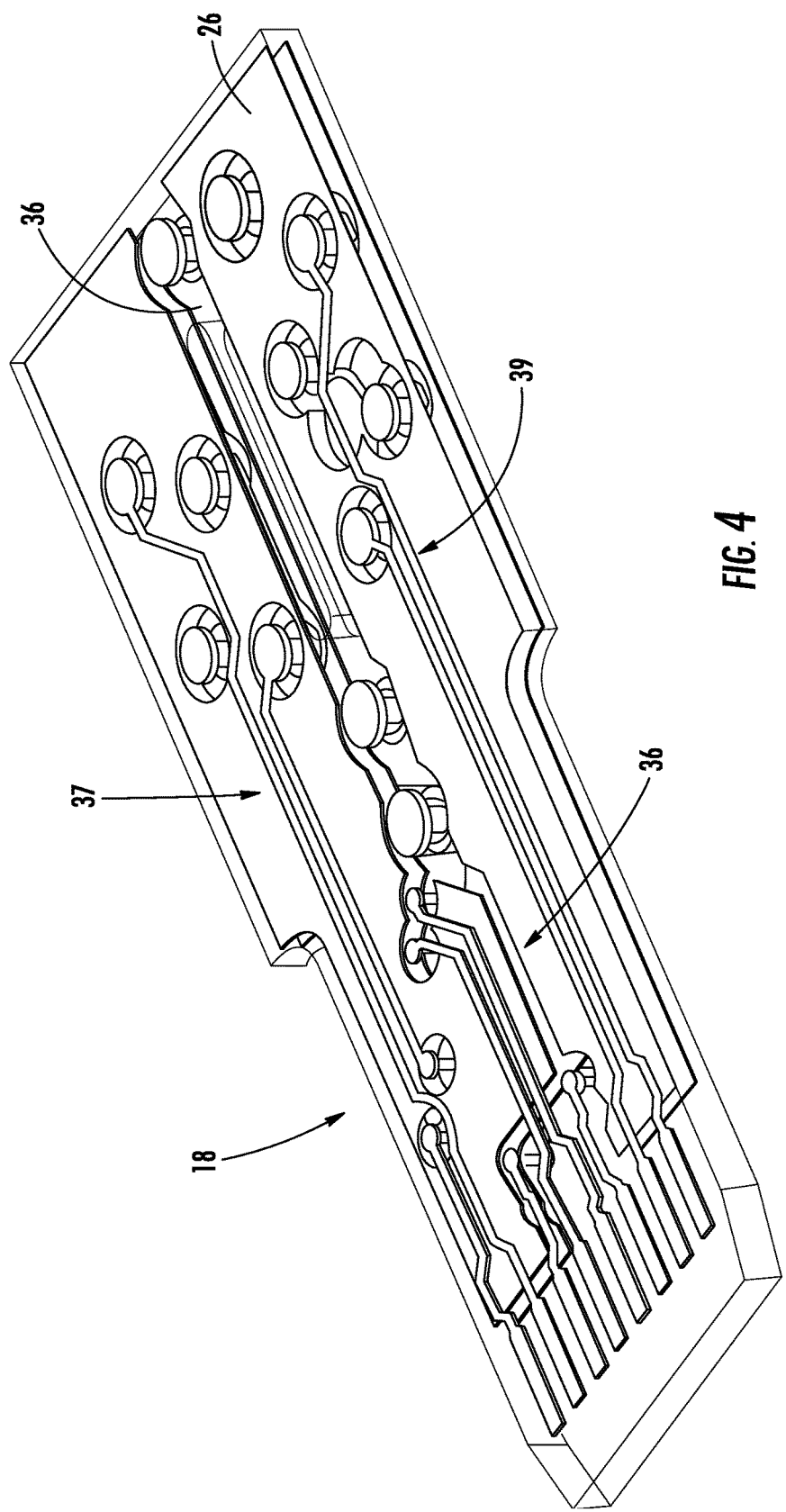
FIG. 4 is a pictorial view of the circuit board of FIGS. 1 and 2.

Referring again to FIG. 5, while item 26 is referred to as a ground plane, it includes at least two, and preferably two, substantially electrically isolated sections, namely, sections 50 and 52 which are separated by gap 36. By referring to sections 50 and 52 as being "substantially electrically isolated" it is meant that the two elements do not contact one another and the gap 36 is wide enough so that electrical energy is not substantially transferred across the gap 36 even at 2,000 MHz. That is, it is important that gap 36 not be so small that substantial current or voltage from section 50 could be transferred to section 52 and vice versa either by capacitive or by inductive coupling. In addition, while it is preferred that sections 50 and 52 of ground plane 26 are on the same plane as illustrated in FIG. 2, it is not intended to exclude sections which are on different planes, however, it is important that sections 50 and 52 not be in electrical contact with one another. It is preferred that the gap 36 be at least 0.08 millimeters wide. It is also preferred that gap 36 not be so wide that the return loss reduction characteristics of ground plane 26 be degraded. It is preferred that gap 36 be no wider than 6.35 millimeters.

Figure 7:
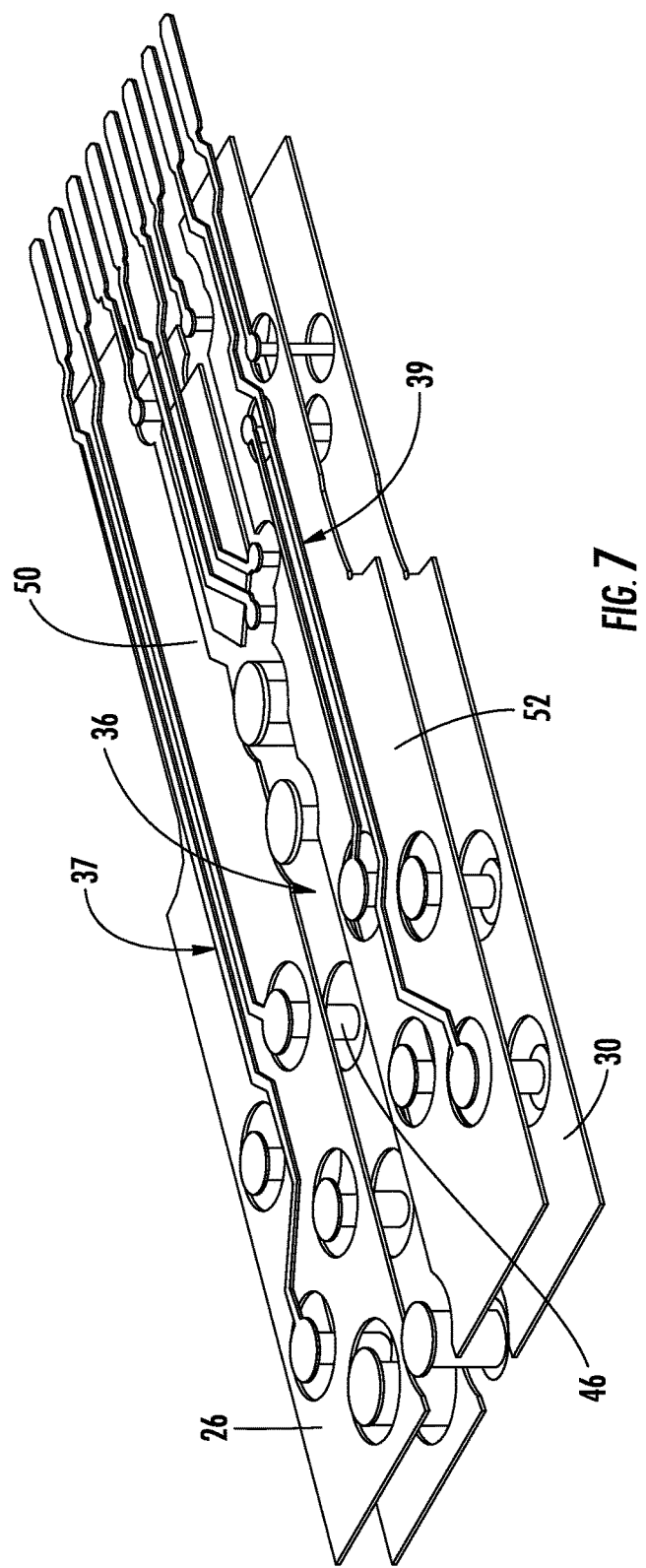
FIG. 7 is a pictorial view of the circuit board of FIG. 6, but with the dielectric materials removed showing the top of the circuit board.
Figure 8:
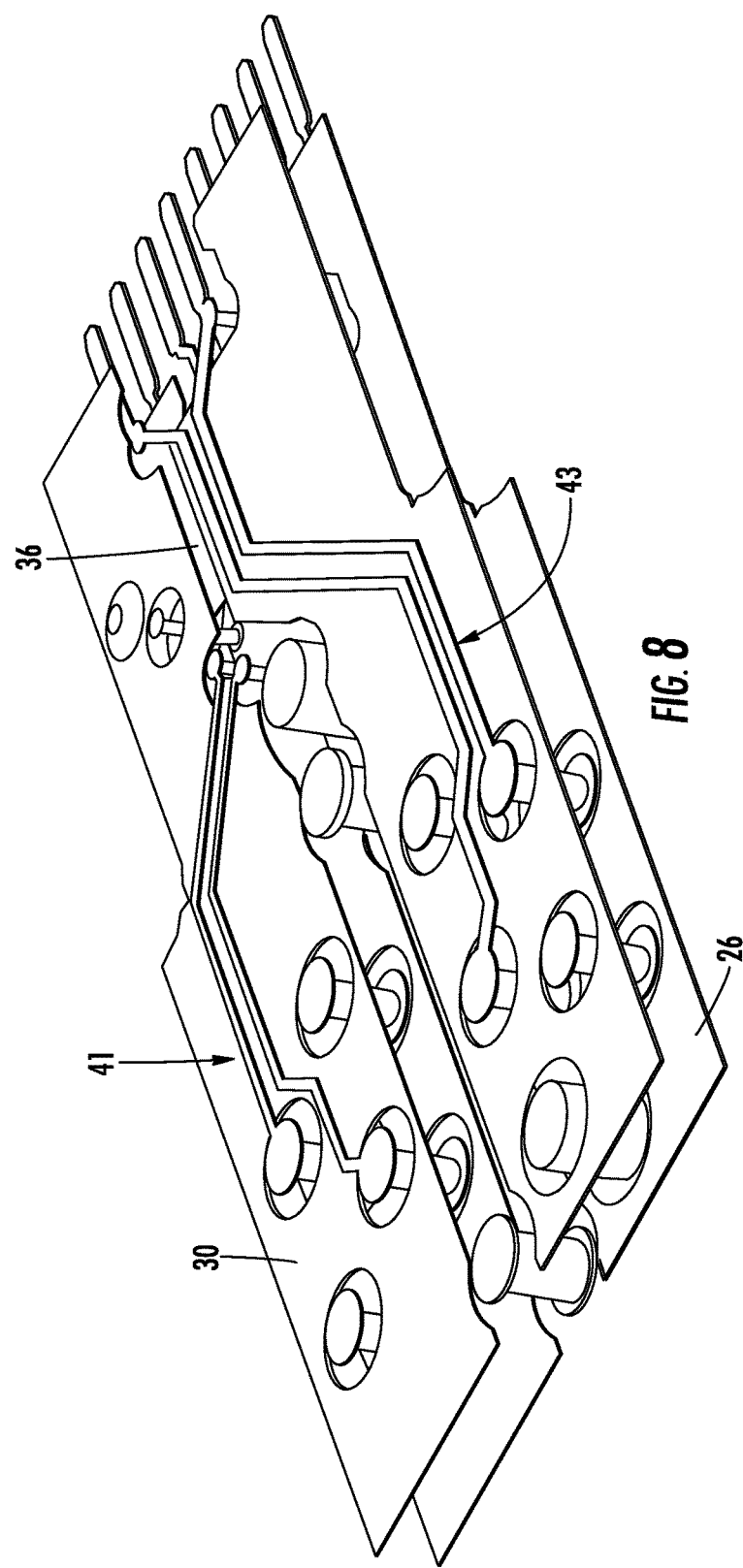
FIG. 8 is a bottom view of the circuit board of FIG. 7.

As can be seen in FIG. 7, pair 37 is above and adjacent to section 50 of split ground plane 26 and pair 39 is above and adjacent to section 52 of split ground plane 26. Any energy transferred from pair 37 to section 50 will not be transferred to section 52 or pair 39 because gap 36 electrically isolates return current of the signal on each trace to sections 50 and 52. The same electrical isolation occurs between the two split sections of ground plane 30 and pair 41 and 43 on the other side of board 18 as shown in FIG. 8. It is also possible that only one trace of pair 37 be adjacent to section 50 and only one trace of pair 39 be adjacent to section 52.

Figure 18:
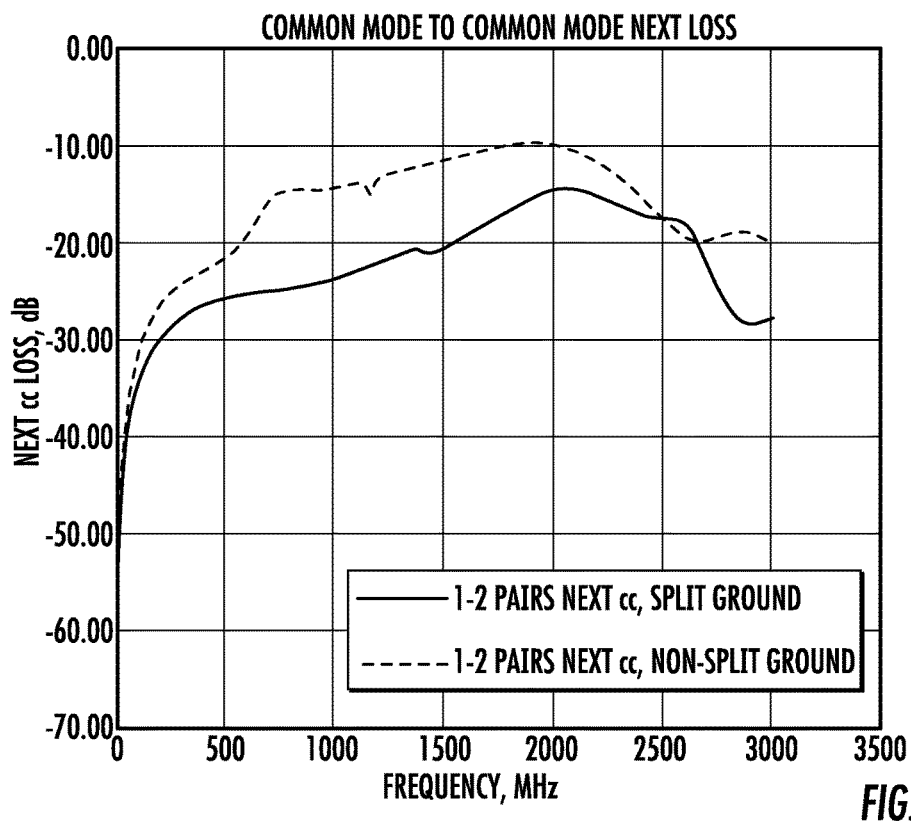
FIG. 18 is a graph showing common mode to common mode NEXT loss comparing a plug having split ground planes of the subject invention and the plug having non-split ground plane for Pairs 1-2.

It has been found that the use of a split ground plane increases common mode isolation between the traces which enhanced differential pair transmission characteristics of plug 10. This is best illustrated in reference to FIGS. 18, 19 and 20. For example, as shown in FIG. 18, a plug having a split ground plane was compared to a plug having a non-split ground plane, with all of the other elements of the plug being the same. As can be seen in FIG. 18, common mode to common mode NEXT loss for pairs 1-2 for the split ground plane achieved greater performance for a bandwidth up to 2,000 megahertz.

Figure 19:
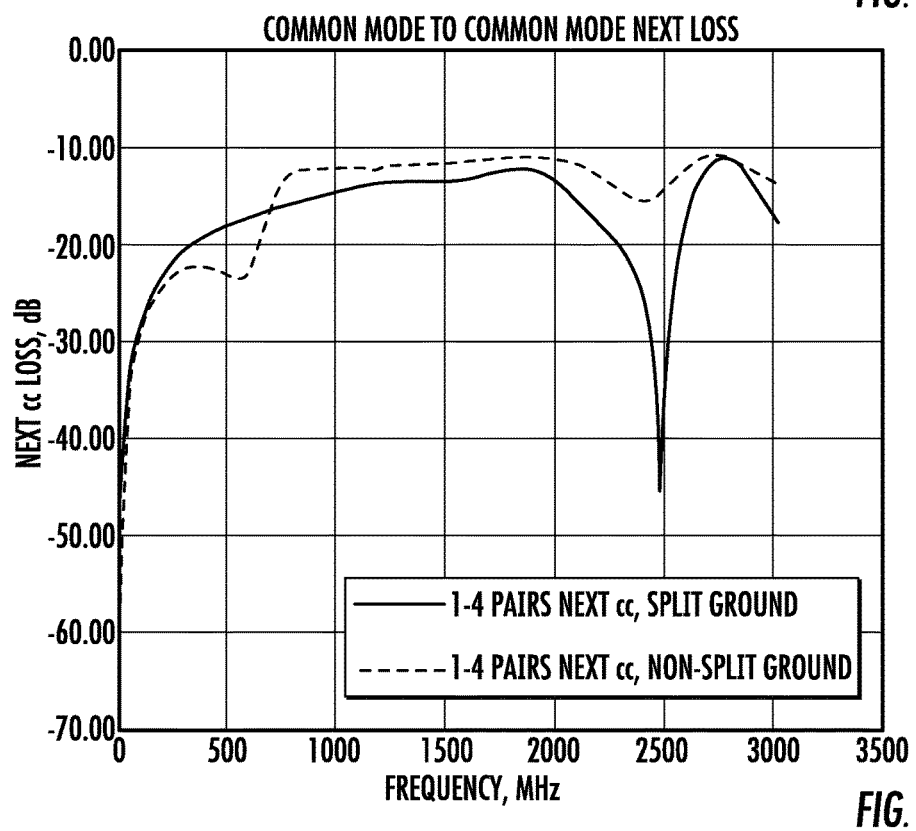
FIG. 19 is a graph showing common mode to common mode NEXT loss comparing a plug having a split ground plane of the subject invention to the plug having a non-split ground plane for Pairs 1-4.
Figure 20:
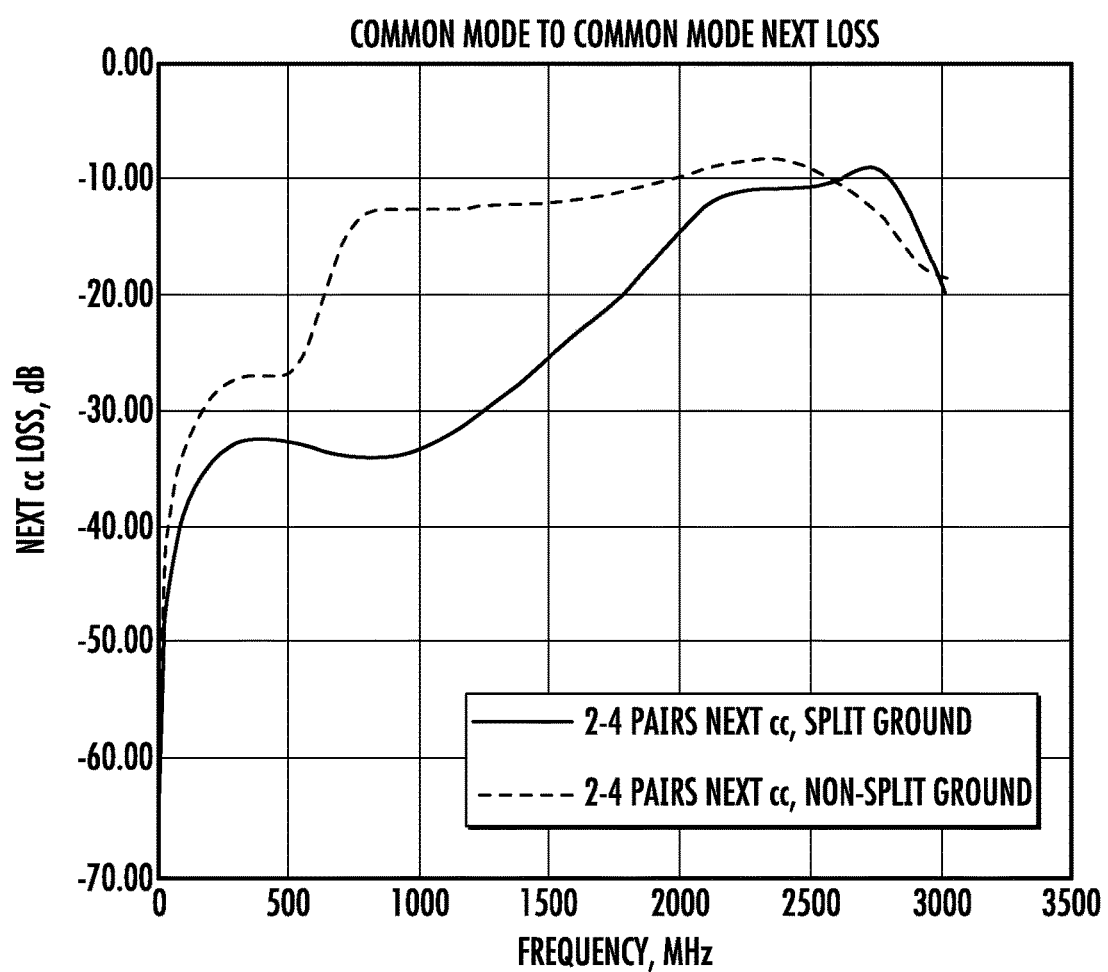
FIG. 20 is a graph showing common mode to common mode NEXT loss comparing a plug having a split ground plane of the subject invention to the plug having a non-split ground plane for Pairs 2-4.

As shown in FIG. 19, common mode to common mode NEXT loss for pairs 1-4 for a plug having a split ground plane was superior to a plug having a non-split ground place as was pairs 2-4 shown in FIG. 20.

Figure 9:
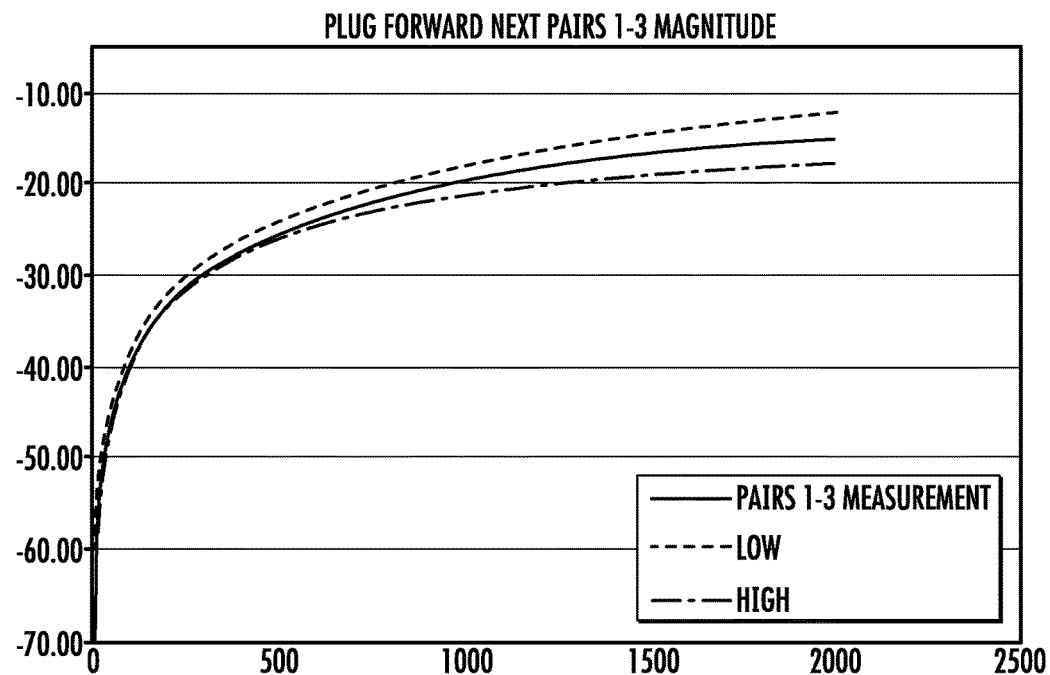
FIG. 9 is a graph showing plug forward NEXT for Pairs 1-3.
Figure 10:
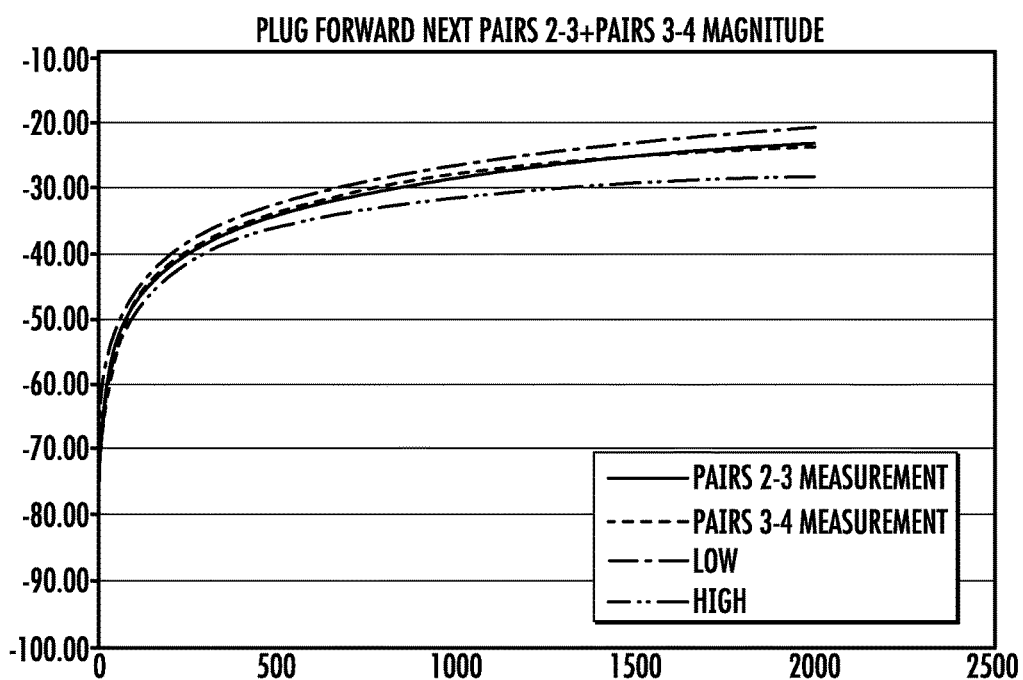
FIG. 10 is a graph showing plug forward NEXT for Pairs 2-3 and Pairs 3-4.
Figure 11:
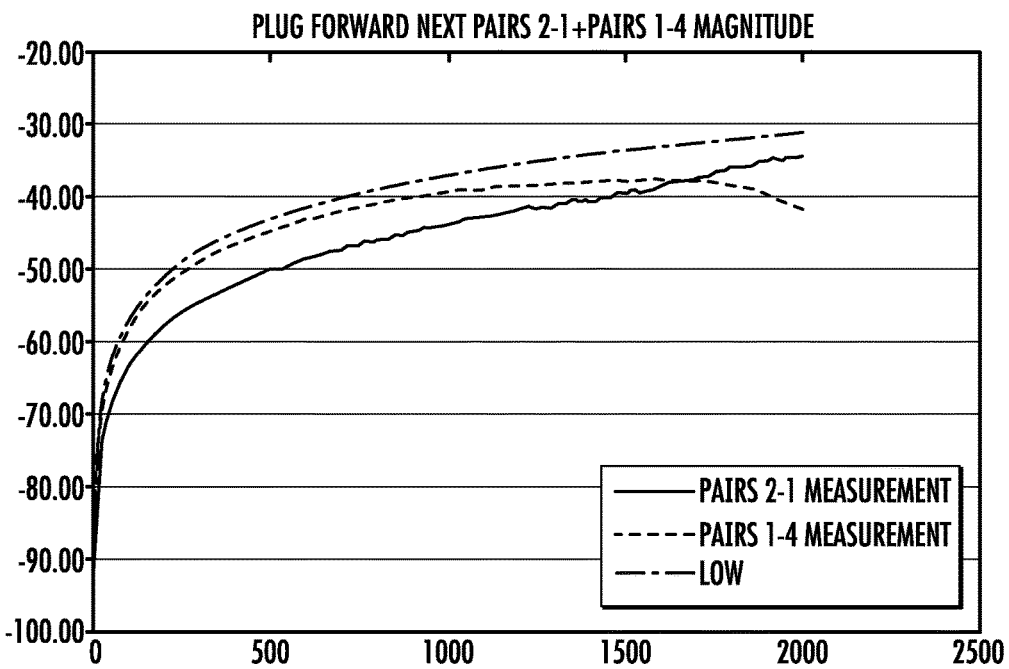
FIG. 11 is a graph showing plug forward NEXT for Pairs 2-1 and Pairs 1-4.
Figure 12:
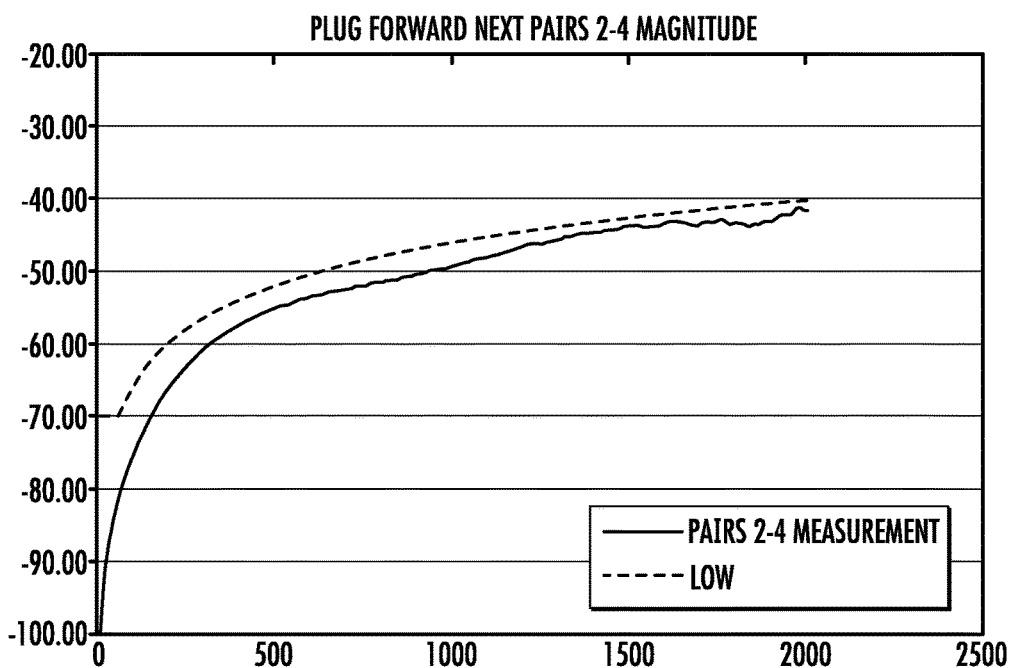
FIG. 12 is a graph showing the plug forward NEXT for Pairs 2-4.

In addition, forward NEXT for the plug of the subject invention having split ground planes 26 and 30 with the gap formed by the split being between approximately 0.45 millimeters and 1.65 millimeters has been measured. FIGS. 9 through 12 show plug forward NEXT magnitude for various pairs measured against the current Category 8 standards. FIG. 9 shows NEXT measurements for pairs 1-3. FIG. 10 shows NEXT measurements for pairs 2-3 and pairs 3-4. FIG. 11 shows NEXT measurements for pairs 1-2 and pairs 1-4. FIG. 12 shows NEXT measurements for pairs 2-4. All of the measurements shown in FIGS. 9-12 exceed the current Category 8 NEXT standard. At 2,000 MHz, the NEXT for pairs 1-3 was approximately −15.1 dB; for pairs 2-3, it was approximately −23.0 dB; for pairs 3-4, it was approximately −23.5 dB; for pairs 1-2, it was approximately −34.3 dB; for pairs 1-4, it was approximately −41.5 dB; and for pairs 2-4, it was approximately −41.4 dB.

Figure 13:
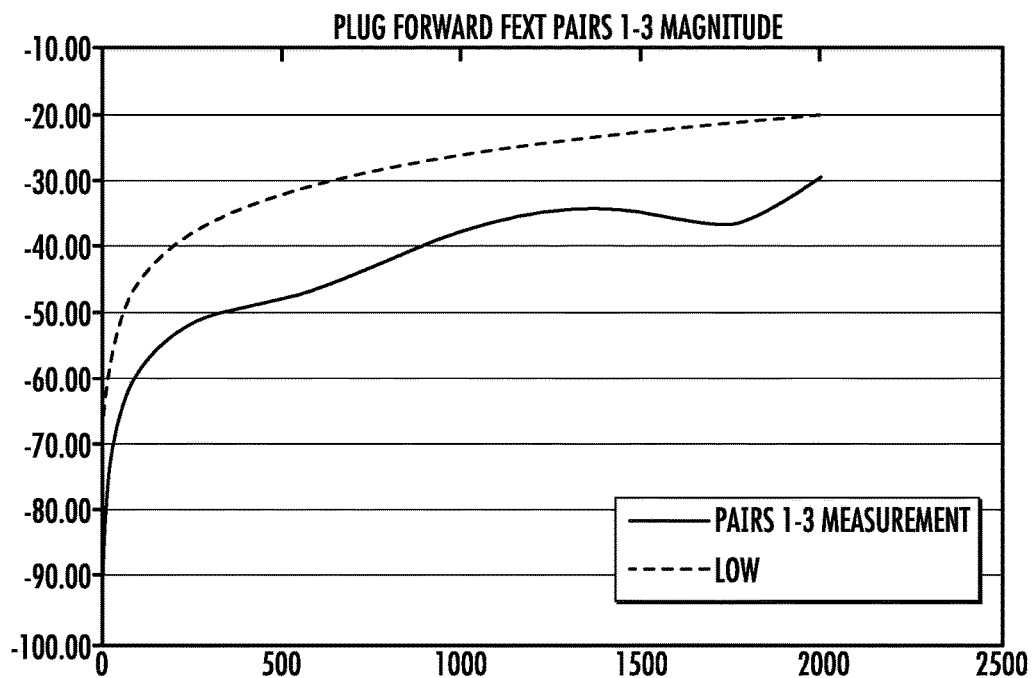
FIG. 13 is a graph showing plug forward FEXT for Pairs 1-3.
Figure 14:
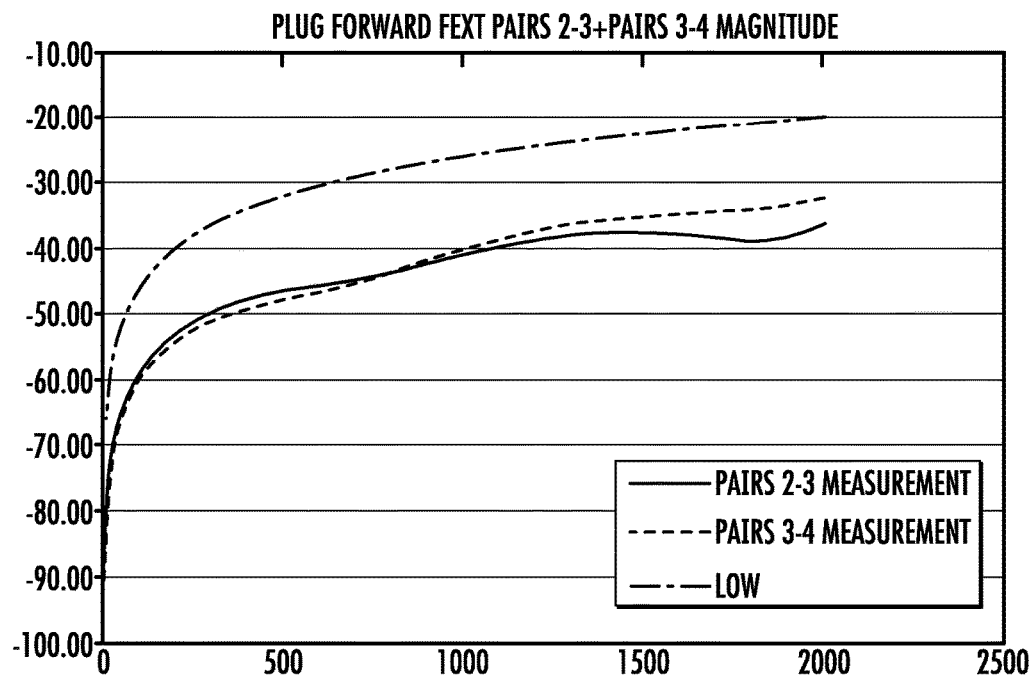
FIG. 14 is a graph of plug forward FEXT for Pairs 2-3 and Pairs 3-4.
Figure 15:
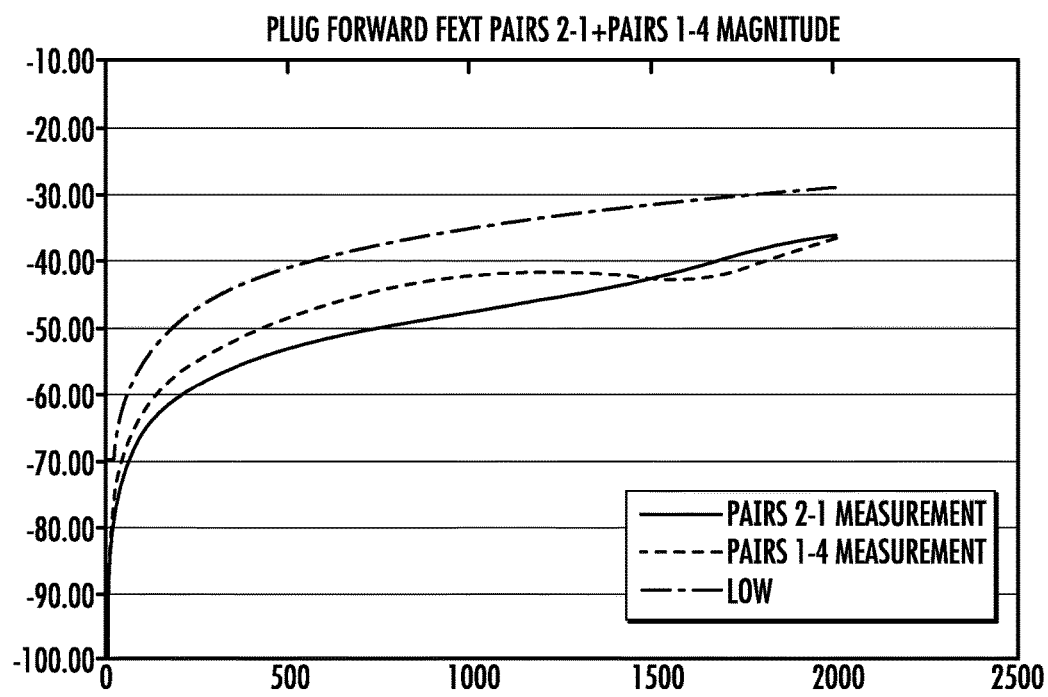
FIG. 15 is a graph showing plug forward FEXT for Pairs 2-1 and Pairs 1-4.
Figure 16:
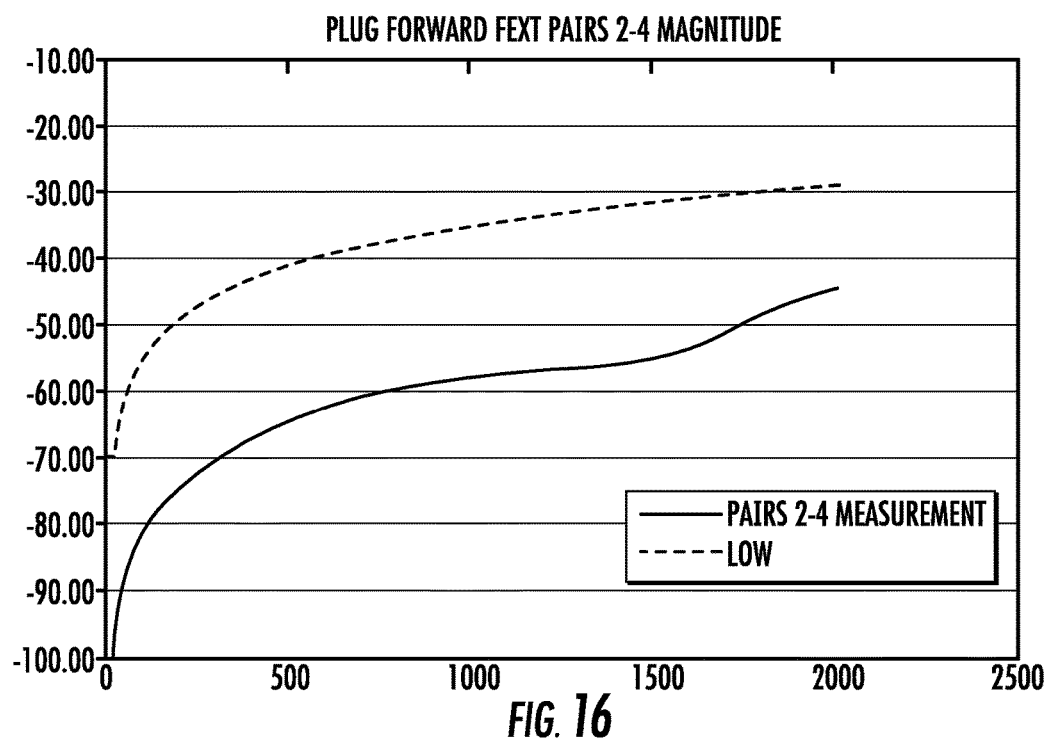
FIG. 16 is a graph showing plug forward FEXT for Pairs 2-4.

Plug forward FEXT for the same plug of the subject invention has also been measured. FIGS. 13 through 16 show plug forward FEXT for various pairs. FIG. 13 shows FEXT measurements for pairs 1-3. FIG. 14 shows FEXT measurements for pairs 2-3 and pairs 3-4. FIG. 15 shows FEXT measurements for pairs 1-2 and pairs 1-4. FIG. 16 shows FEXT measurements for pairs 2-4. All of these readings show that the plug of the subject invention exceeds the current Category 8 FEXT standard. At 2,000 MHz, the FEXT for pair 1-3 was approximately −29.3 dB; for pairs 2-3, it was approximately −36.1 dB; for pairs 3-4, it was approximately −32.3 dB; for pairs 1-2, it was approximately −36.2 dB; for pairs 1-4, it was approximately −36.7 dB; and for pairs 2-4, it was approximately −44.5 dB.

Figure 17:
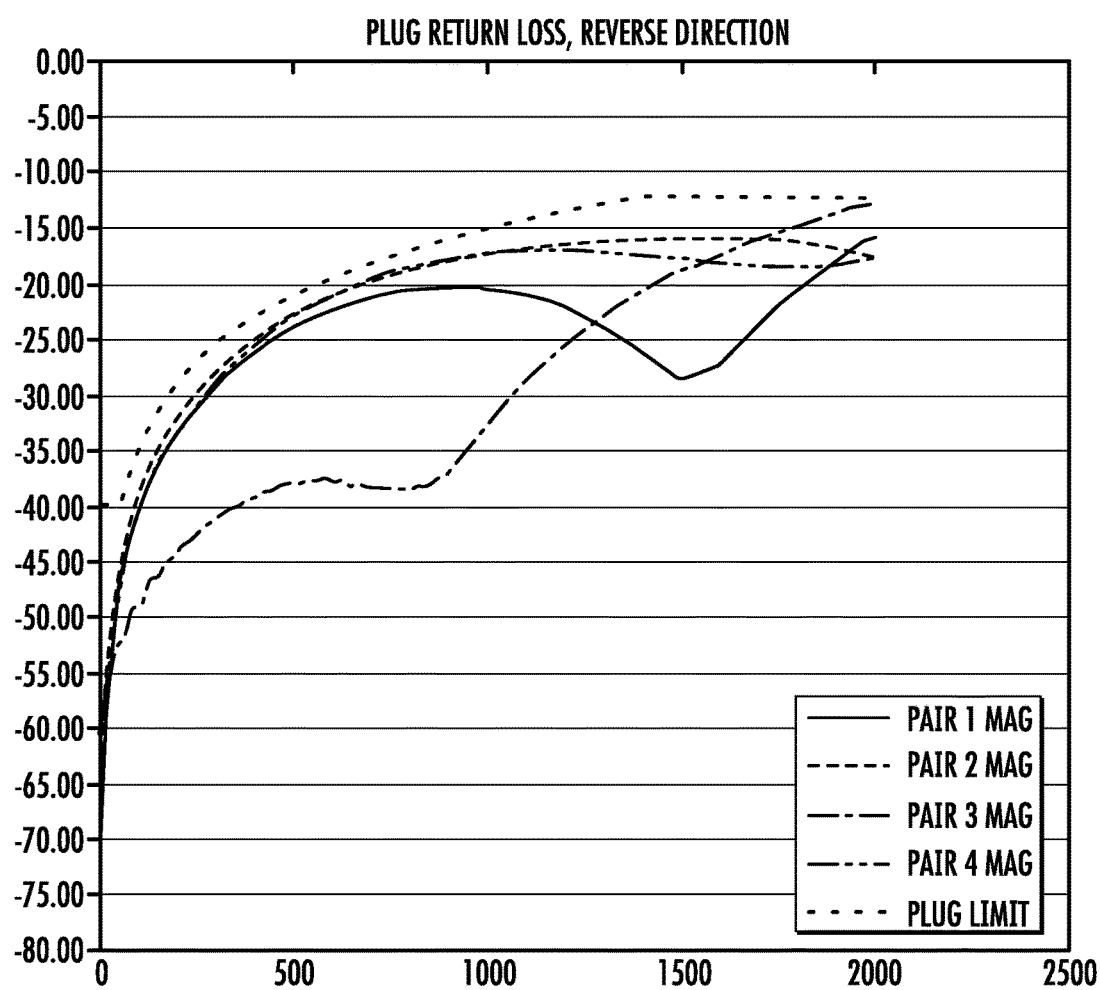
FIG. 17 is a graph showing plug return loss, reverse direction for all four pairs.

FIG. 17 shows the return loss for all four pairs for the same plug of the subject invention which also exceed the draft Category 8 standard for return loss as of Dec. 1, 2014. At 2,000 MHz, the return loss for pair 1 was approximately −15.5 dB; for pair 2, it was approximately −17.3 dB; for pair 3, it was approximately −12.5 dB; and for pair 4, it was approximately −17.3 dB.

Referring again to FIG. 3, fourth or center layer 28 of the circuit board 18 is made from an inexpensive standard dielectric material such as FR4 as the central core and is used primarily as a substrate for the circuit board. FR4 is made from woven fiberglass cloth with an epoxy resin binder and has a fairly high dielectric constant, dependent on the frequency of the signal, such as, for example, a dielectric constant of 4.5. However, the material which more directly affects the transmission qualities of the plug is the dielectric used for the second layer 24 and the sixth layer 32 of the circuit board, because those layers are in close proximity to the traces in layers 20 and 34. The dielectric second and sixth layers have a dielectric constant less than 4.5 and preferably no more than 3.7. This lower dielectric constant material is well suited to high frequency content and supports the higher frequency transmission of Category 8, i.e., up to 2,000 megahertz. It is preferred that the material in the second layer and in the sixth layer be FR408. FR408 is also made from woven fiberglass cloth with an epoxy resin binder but is designed for faster signal speeds. It has been found that the use of the FR408 as the second and sixth layers helps enable the improved differential return loss referred to above. The second and sixth FR408 layers should be thinner than the fourth FR4 layer. Preferably, the thickness of the second and sixth layers are 0.127±0.025 mm. Since FR408 is more expensive than FR4, substantial cost benefits are achieved by using only thin layers of FR408 without degrading signal quality. The thickness of the FR408 could be any standard available size. The PCB referred to herein uses 0.005 inch layers. The thickness is driven by the desired trace geometry.

The use of a ground plane in an RJ45 plug improves return loss. However, Applicant has found that without the use of split or gap 36 in ground plane 26, cross talk with respect to the conductor pairs becomes a problem. The split in the ground plane forces return currents of the transmission lines to remain in proximity to the transmission lines, resulting in increased common mode isolation between traces of plug and thus reduced cross talk. Preferably, the thickness of ground plane 26 is in the range of 0.0178 millimeters to 0.0771 millimeters. In addition, it is preferred that ground plane 26 be made of copper. It is also preferred that the distance between traces on one side of circuit board 18 and its adjacent ground plane 26 be between 0.051 millimeters and 0.61 millimeters. The use of the term split ground plane as used herein can also mean two or more separate ground planes. The separate ground planes or separate sections of a split ground plane may or may not be at the same potential. It has been found that placement of the split ground plane below pairs of traces as defined in the connector PCB allows tuning of coupling parameters between other pairs and individual conductors in the overall plug.

Figure 21:
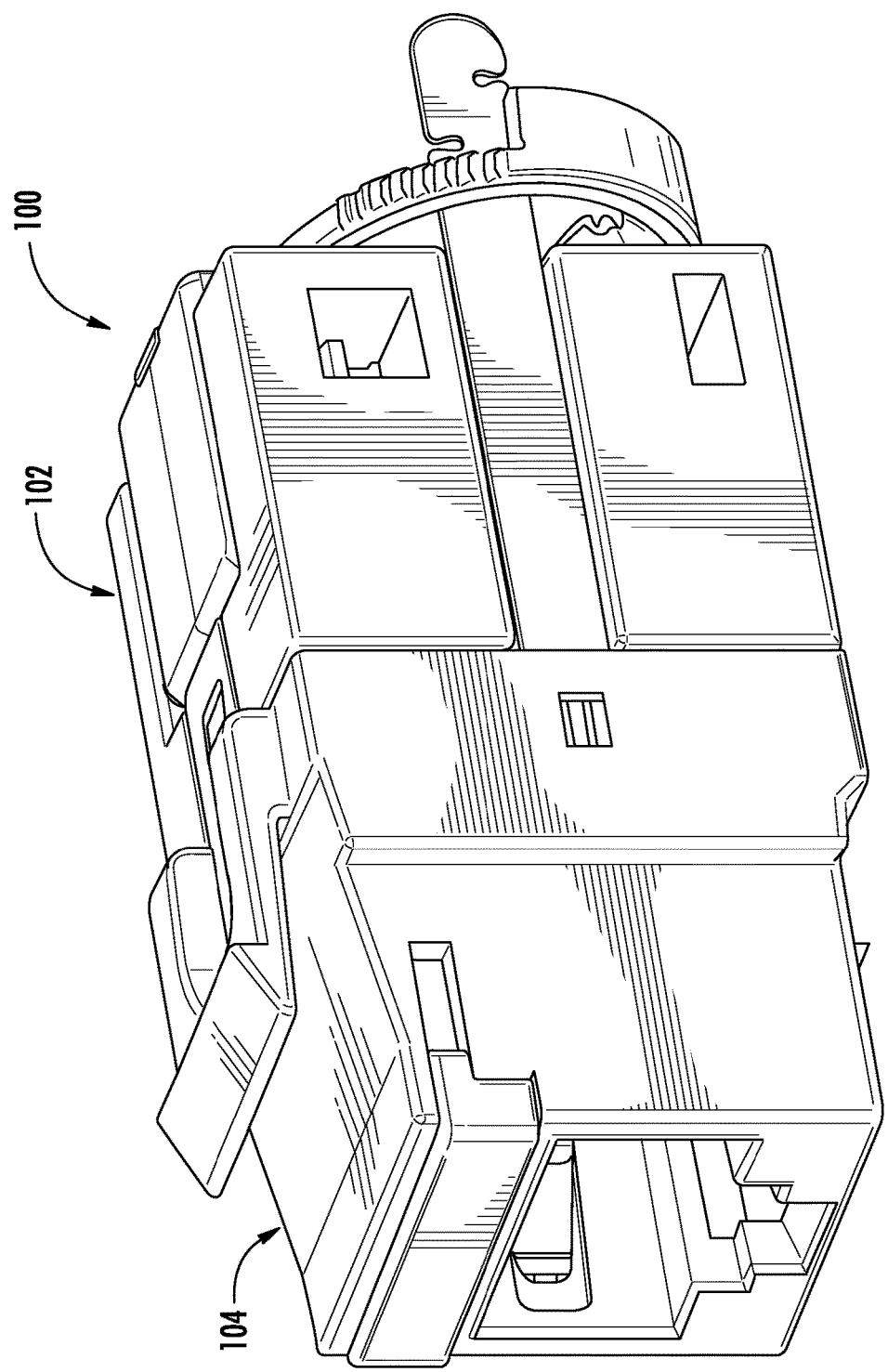
FIG. 21 is a perspective view illustrating the receptacle and cable termination components of the present invention.
Figure 22:
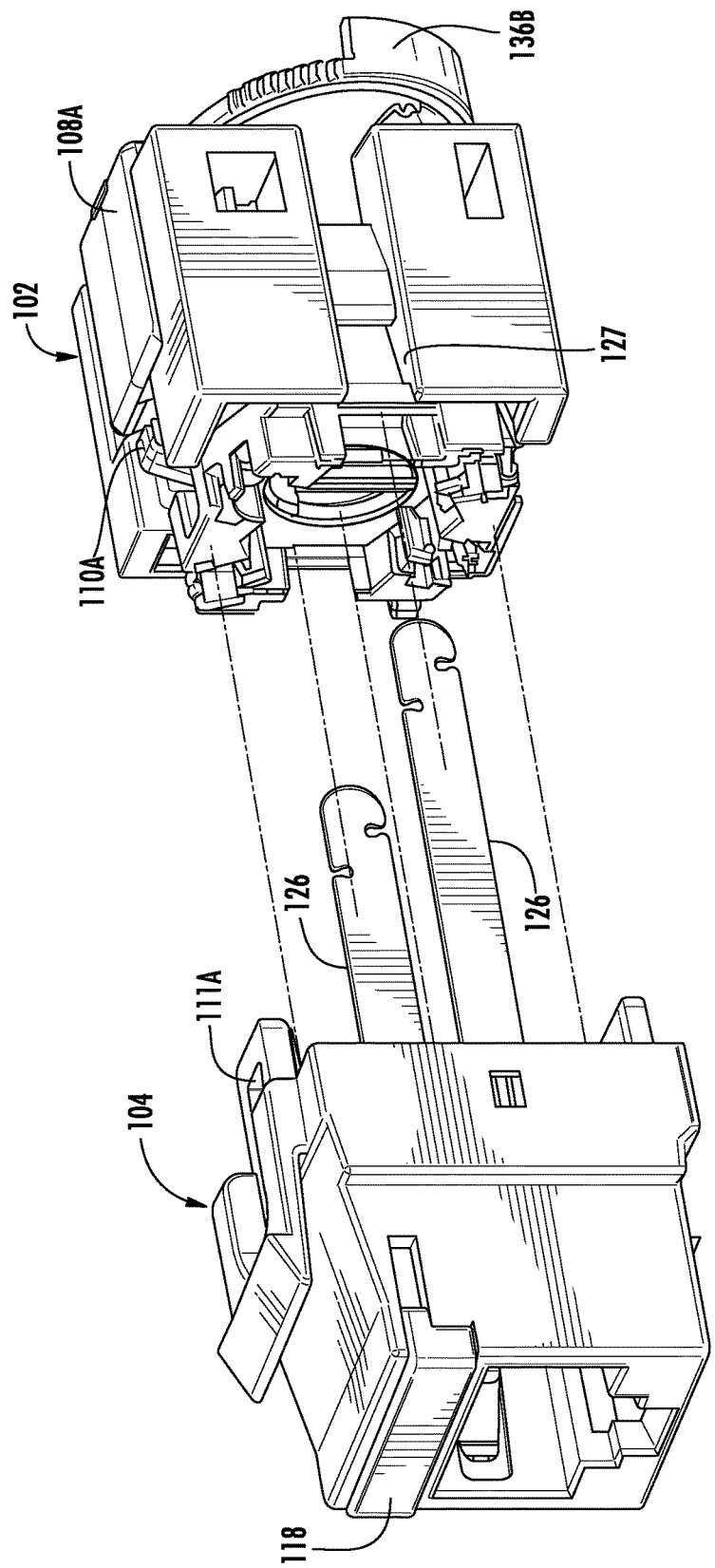
FIG. 22 is a perspective view illustrating the receptacle and cable termination components secured together.
Figure 23:
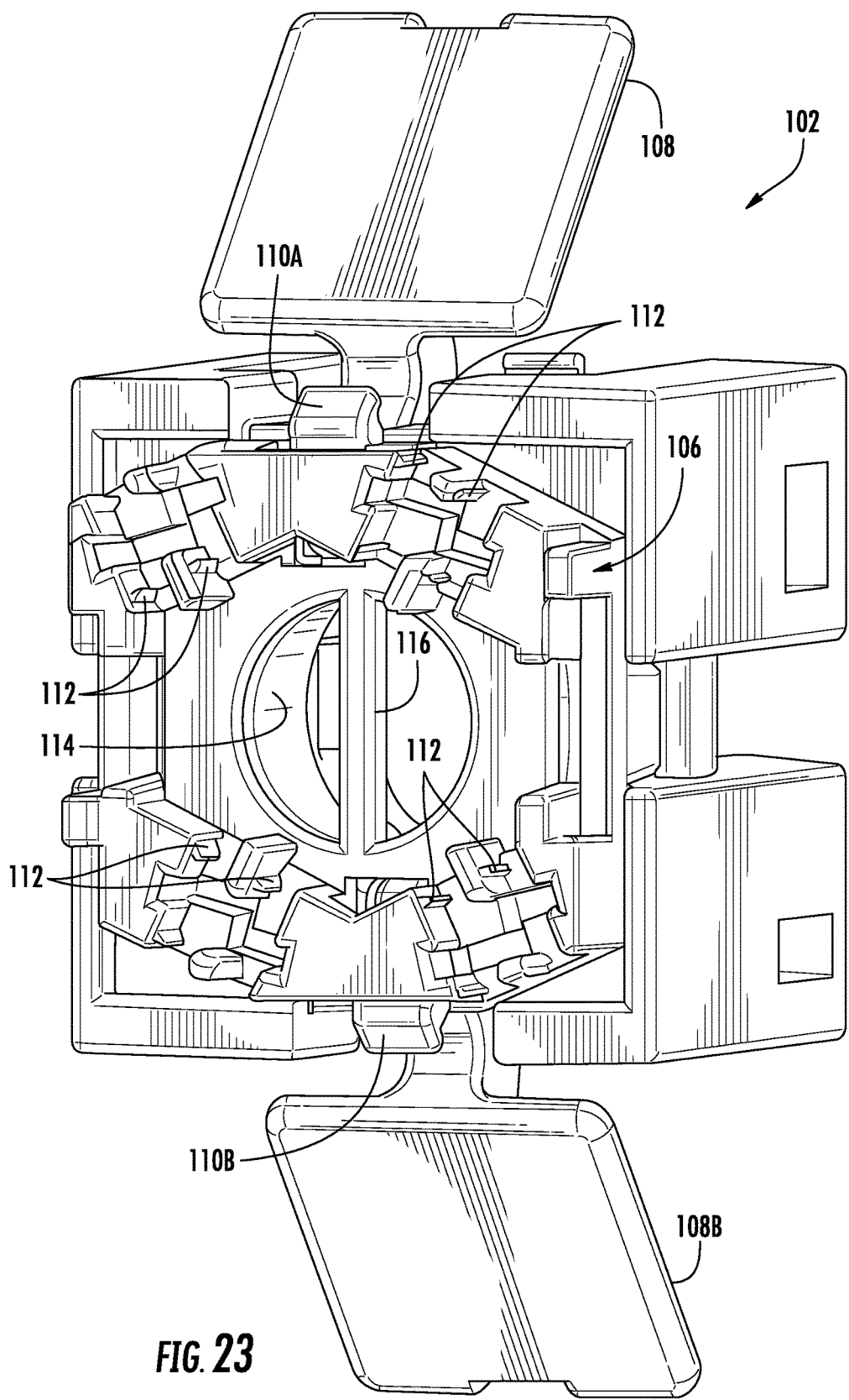
FIG. 23 is a perspective view illustrating the cable termination component.
Figure 24:
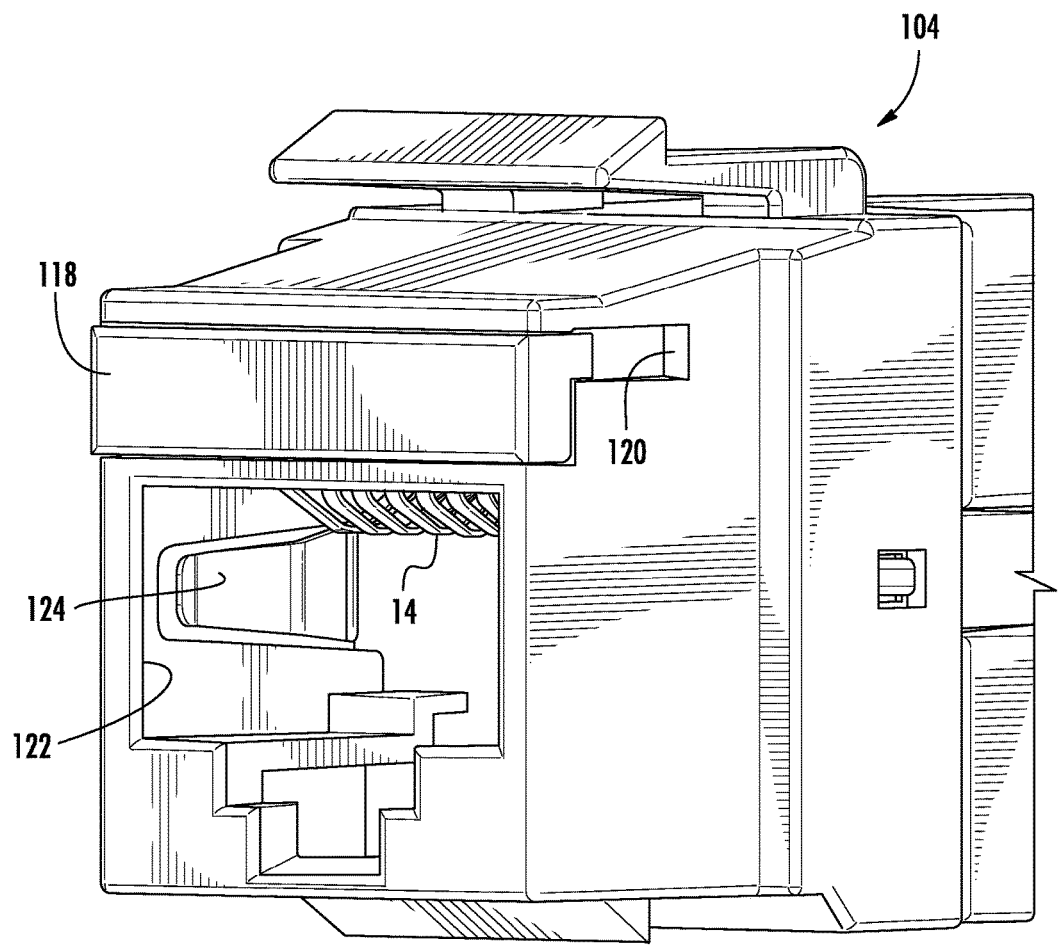
FIG. 24 is a perspective view illustrating the receptacle component secured to the cable termination component.

Referring initially to FIGS. 21-23, the jack 100 includes a cable termination component 102 and receptacle component 104. The cable termination component 102 includes a front end and a rear end and is sized and configured for selective receipt of a plurality of conductor pairs of a cable 200 (see FIG. 33). A stuffer cap component 106, which may be separate from or integrally formed as part of the cable termination component 102, includes first and second lever arms 108A and 108B each having a respective hook element 110A and 110B, a plurality of slots 112, and opening 114 with cross bar 116.

Each lever arm 108A and 108B includes a distal end that is free and a proximal end that is pivotally secured to the stuffer cap component 106, wherein the proximal end has the corresponding hook element 110A and 110B sized and configured for engaging a corresponding latch element 111A and 111B (not shown) on the receptacle component 104. Each lever arm 108A and 108B is selectively operable between an open position and a closed position, wherein force exerted by a user on the distal end either lever arm 108A and 108B when in the open position causes the hook element 110A and 110B to engage the corresponding latch element 111A and 111B to secure the cable termination component 102 to the receptacle component 104, thereby defining the closed position, as illustrated in FIG. 21. In one embodiment, the first and second hook elements 110A and 110B and corresponding latch elements 111A and 111B are oppositely disposed on the cable termination component 102 and receptacle component 104, respectively. In operation, use of the lever arms 108A and 108B to secure the cable termination component 102 to the receptacle component 104 completes termination without requiring the use of secondary tools.

Still referring to FIGS. 21-23, prior to securing the cable termination component 102 to the receptacle component 104, the wires of each of the plurality of conductor pairs of cable are selectively pressed into one of the plurality of slots 112 to secure them therein.

Figure 25:
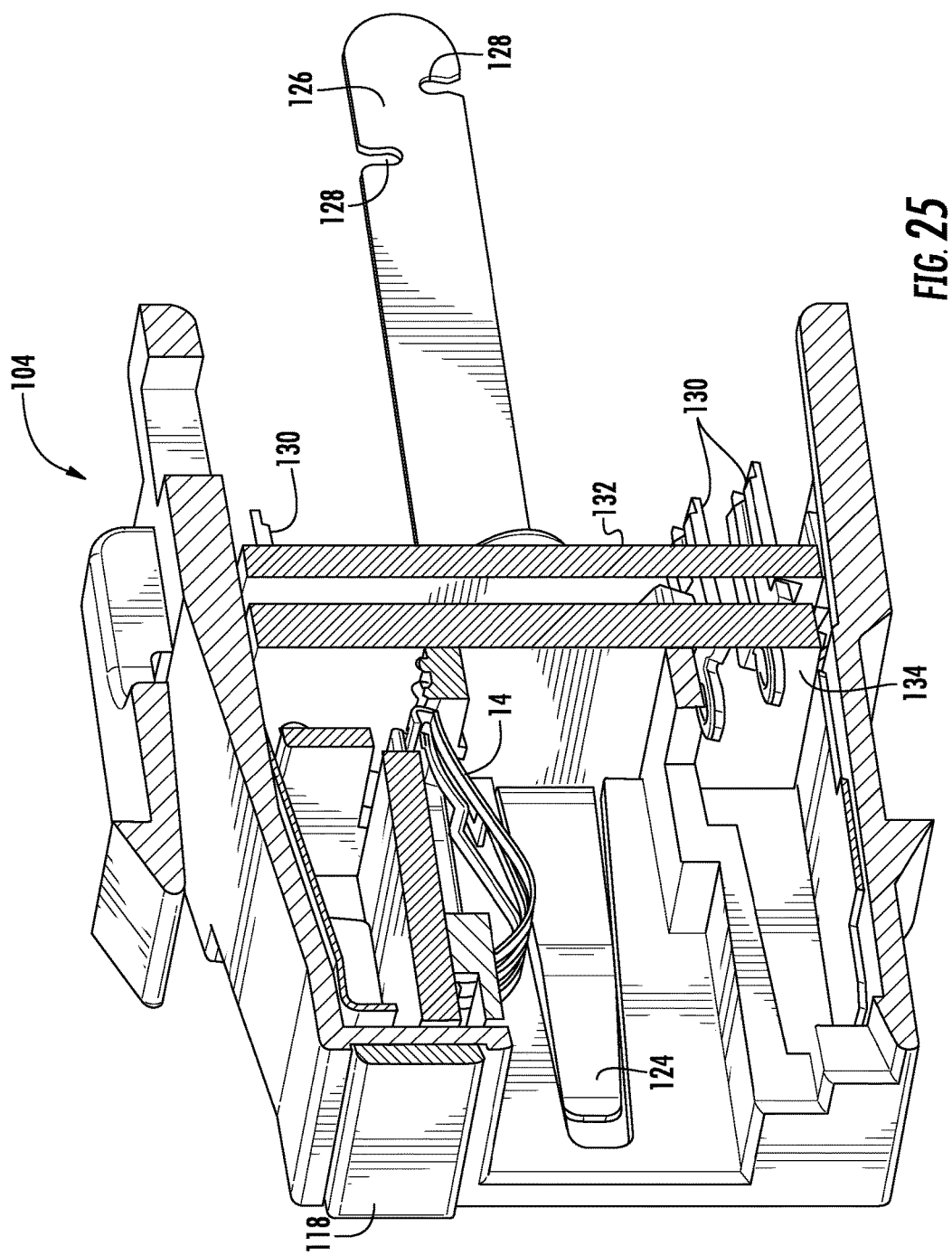
FIG. 25 is a perspective view, shown in cross section, illustrating the receptacle component.
Figure 26:
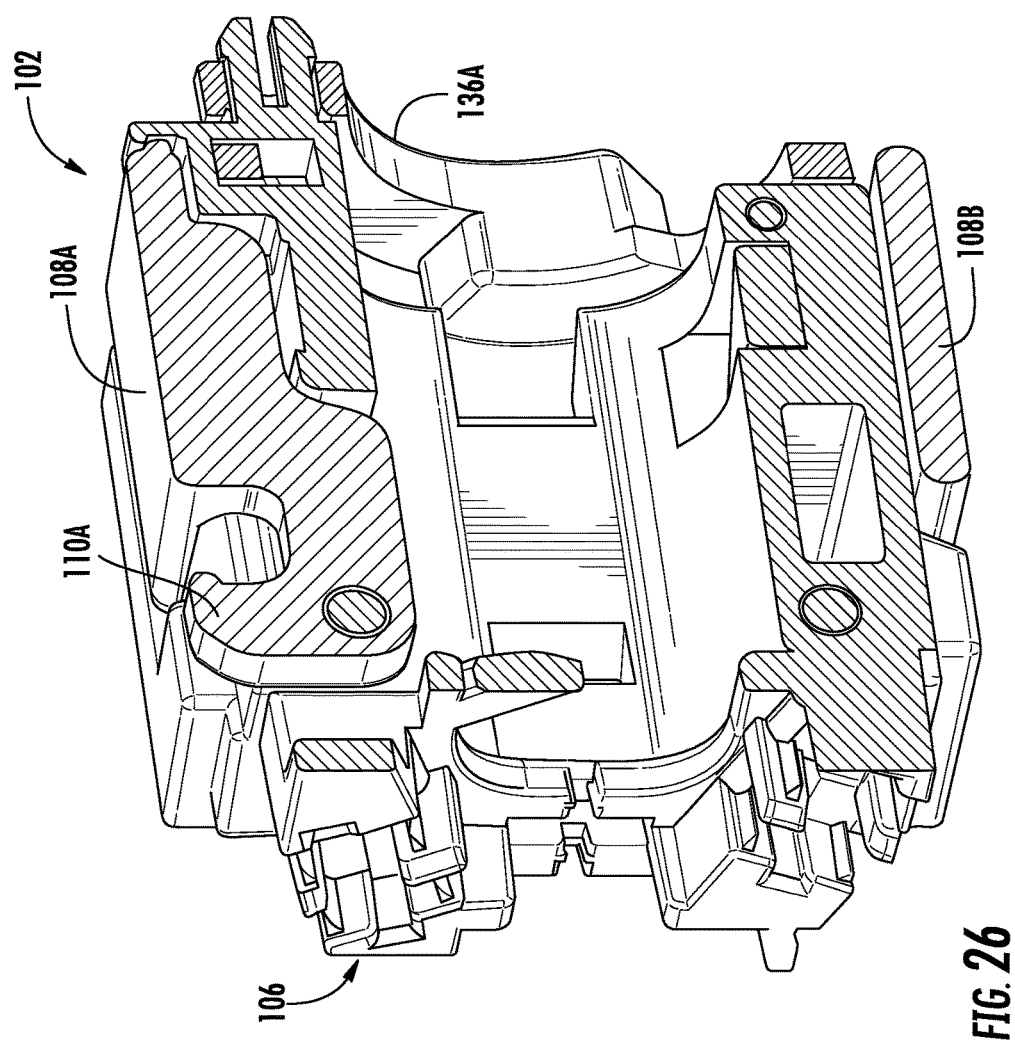
FIG. 26 is a perspective view, shown in cross section, illustrating the cable termination component.
Figure 27:
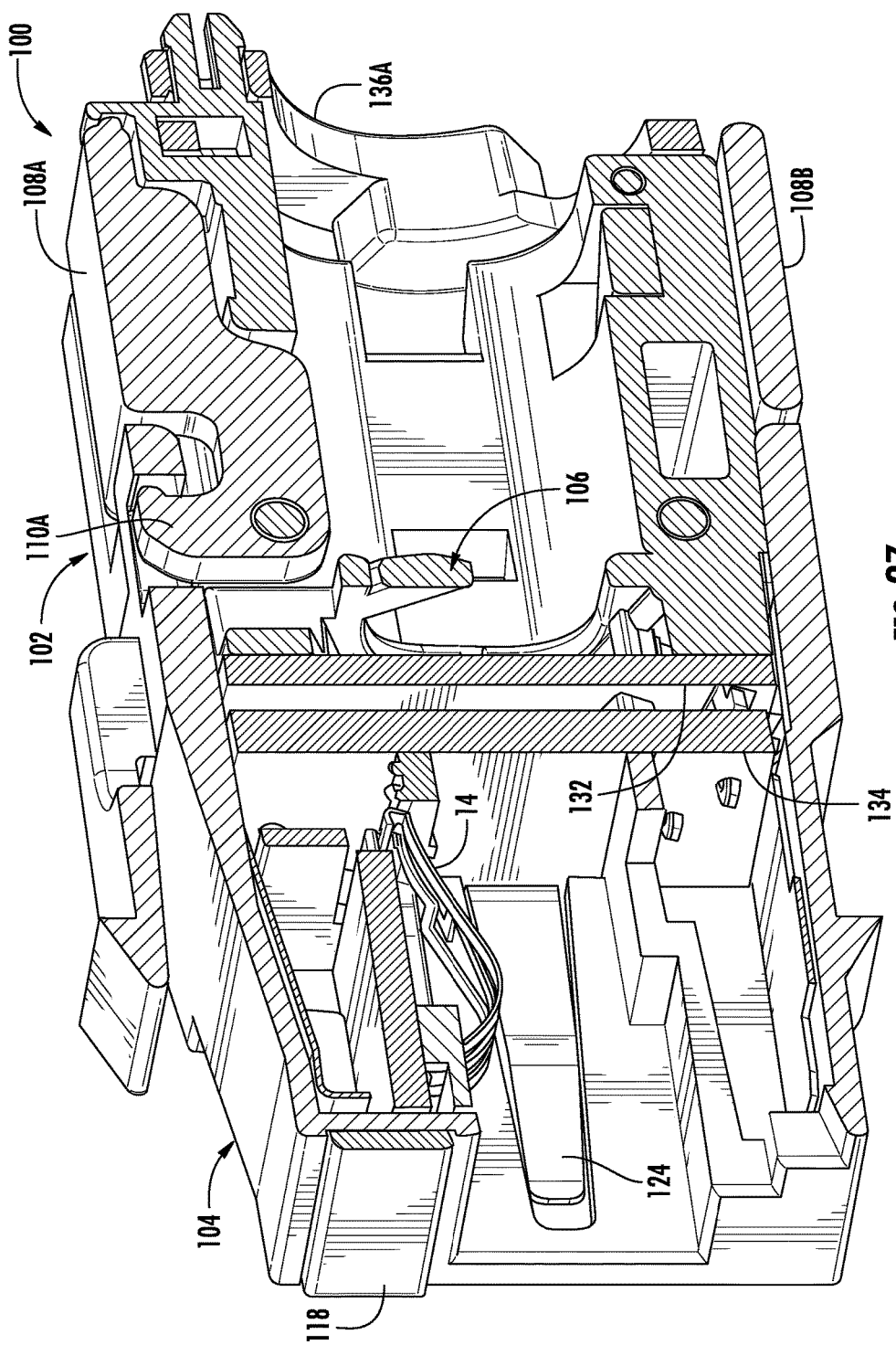
FIG. 27 is a perspective view, shown in cross section, illustrating the receptacle and cable termination components secured together.
Figure 28:
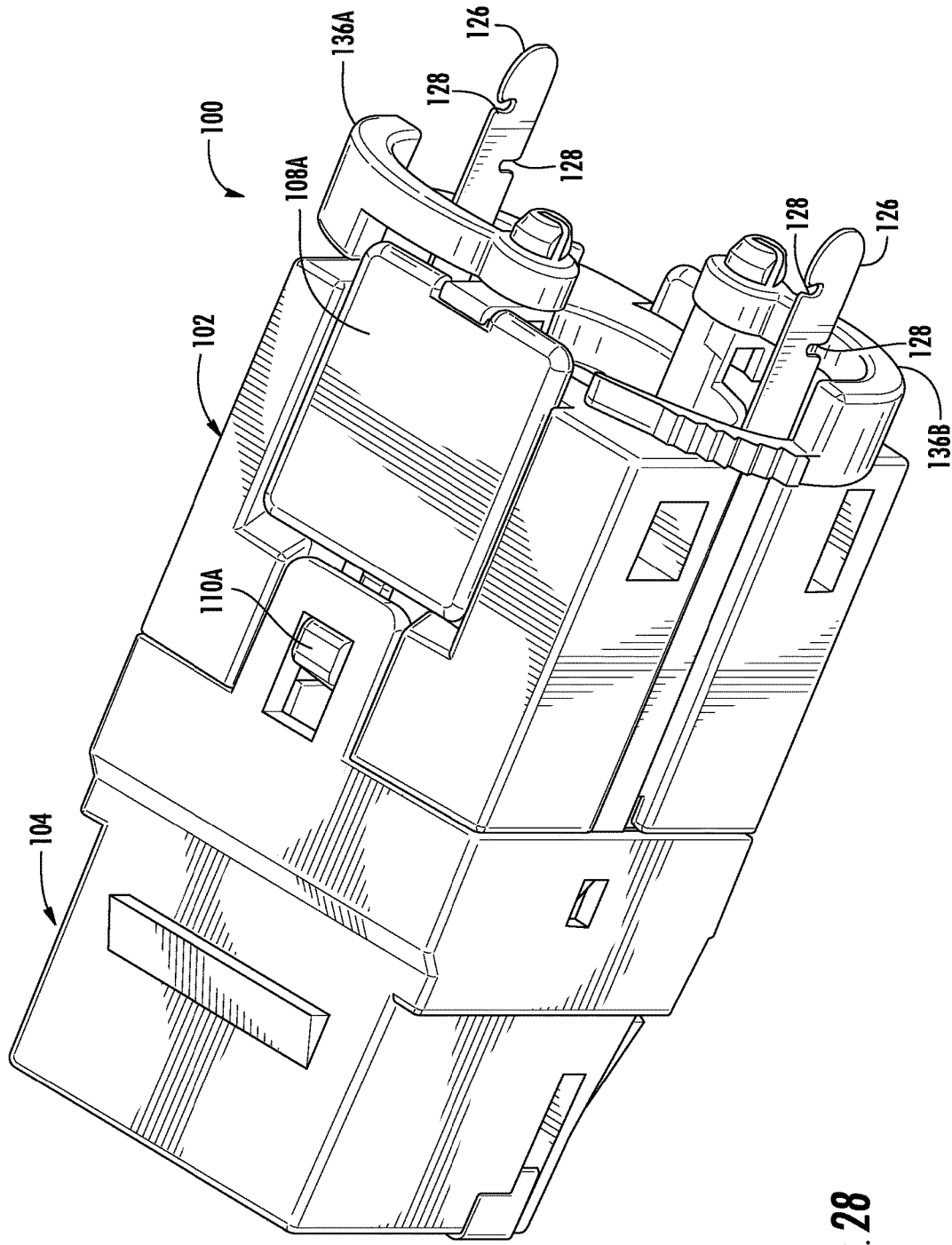
FIG. 28 is a perspective view illustrating the receptacle and cable termination components secured together.
Figure 29:
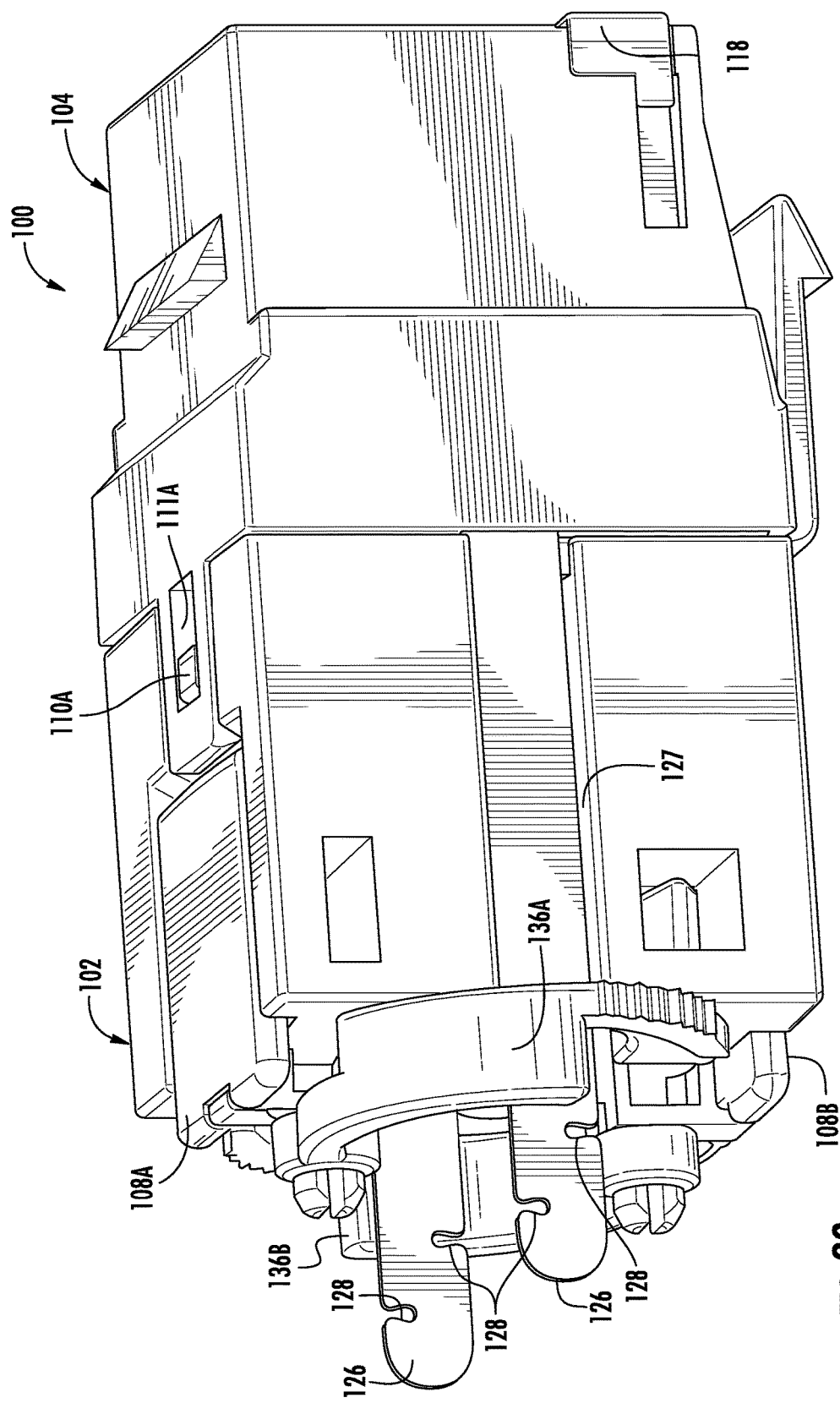
FIG. 29 is a perspective view illustrating the receptacle and cable termination components secured together.
Figure 30:
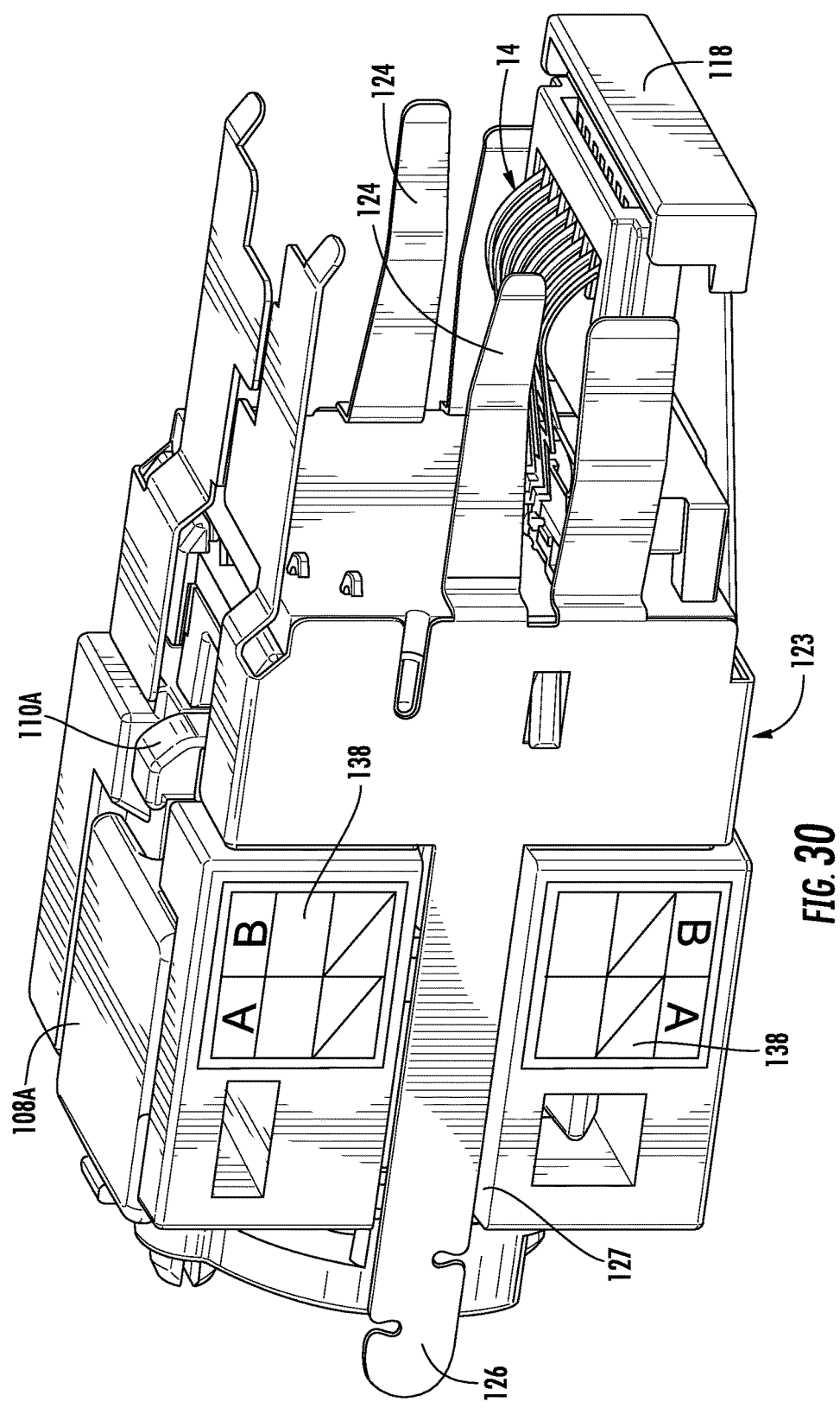
FIG. 30 is a perspective view illustrating the receptacle and cable termination components secured together, but with the housing of the receptacle component removed.

Referring to FIGS. 24-27, the receptacle component 104 includes a plurality of electrical contacts 14 accessible via port 122, defined by the housing of the receptacle component 104. The receptacle component 104 includes a full face icon 118 sized for receipt against recessed surface 120. In one embodiment, the full face icon 118 includes clips for attachment to corresponding sides of the recessed surface 120. The full face icon 118 allows for greater surface area to display information thereon. Specifically referring to FIG. 24, opposing first segments of internal cable shield 124 are accessible via port 122. Specifically referring to FIG. 25, a plurality of offset-positioned insulation displacement contacts (IDCs) 130 on IDC housing 132 are included, each of the plurality of offset-positioned IDCs being aligned for engaged abutment with a corresponding one of the wires of the plurality of conductor pairs when the cable termination component 102 and the receptacle component 104 are coupled. The primary printed circuit board (PCB) 134 of the jack 100 may be housed in the receptacle component 104, as illustrated in FIG. 25.

One embodiment of the jack 100 may include an internal cable shield 124. The internal cable shield 124 may be formed from one or more conductive materials and substantially surrounds the plurality of offset-positioned IDCs 130 on the receptacle component 104 and includes first and second protrusions 126 extending therefrom and being sized and configured to extend alongside opposing, outer-facing sides of the cable termination component 102 when the receptacle component 104 is secured to the cable termination component 102, wherein the first and second protrusions 126 extend adjacently to a portion of the cable 200. In one embodiment, the cable termination component 102 includes recessed surfaces 127 sized for passage of the first and second protrusions 126. Each of the first and second protrusions 126 includes one or more notches 128, each notch 128 being sized and configured for receipt of a cable drain wire (not pictured). In a preferred embodiment, the notches 128 are teardrop-shaped to facilitate securement of the cable drain wire thereto.

The internal cable shield 124 serves as a conductive wrap which may be substantially located inwards of the plastic housing of the receptacle component 104, as there is a practical need for part of the internal cable shield 124 to protrude from the housing in order to, for example, make contact with the mounted panel. As the internal cable shield 124 is primarily located inwards of the housing, the jack 100 may effectively be color coded.

Referring to FIGS. 28-30, 32 and 33, a cable ratcheting assembly on the rear end of the cable termination component 102 includes first and second pivoting clamps 136A and 136B, which may each be selectively pivoted into abutment with the cable 200 in order to relieve stress on the cable 200 at the location the cable 200 enters cable termination component 104. Labels 138 may be included on the cable termination component 102 for ready identification purposes.

Figure 31:
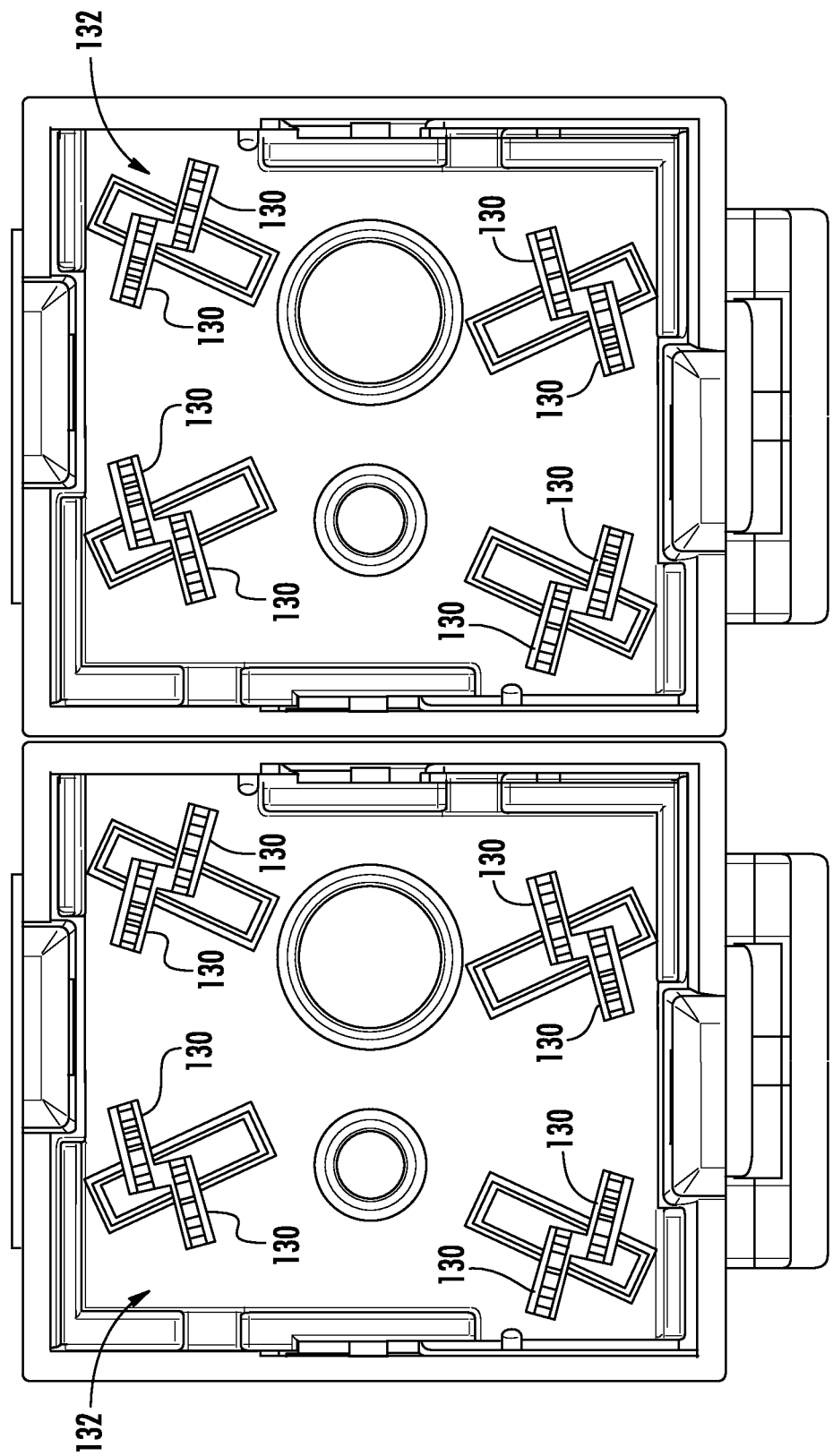
FIG. 31 is a side elevational view of first and second communication connectors illustrating the offset location of the IDCs.
Figure 32:
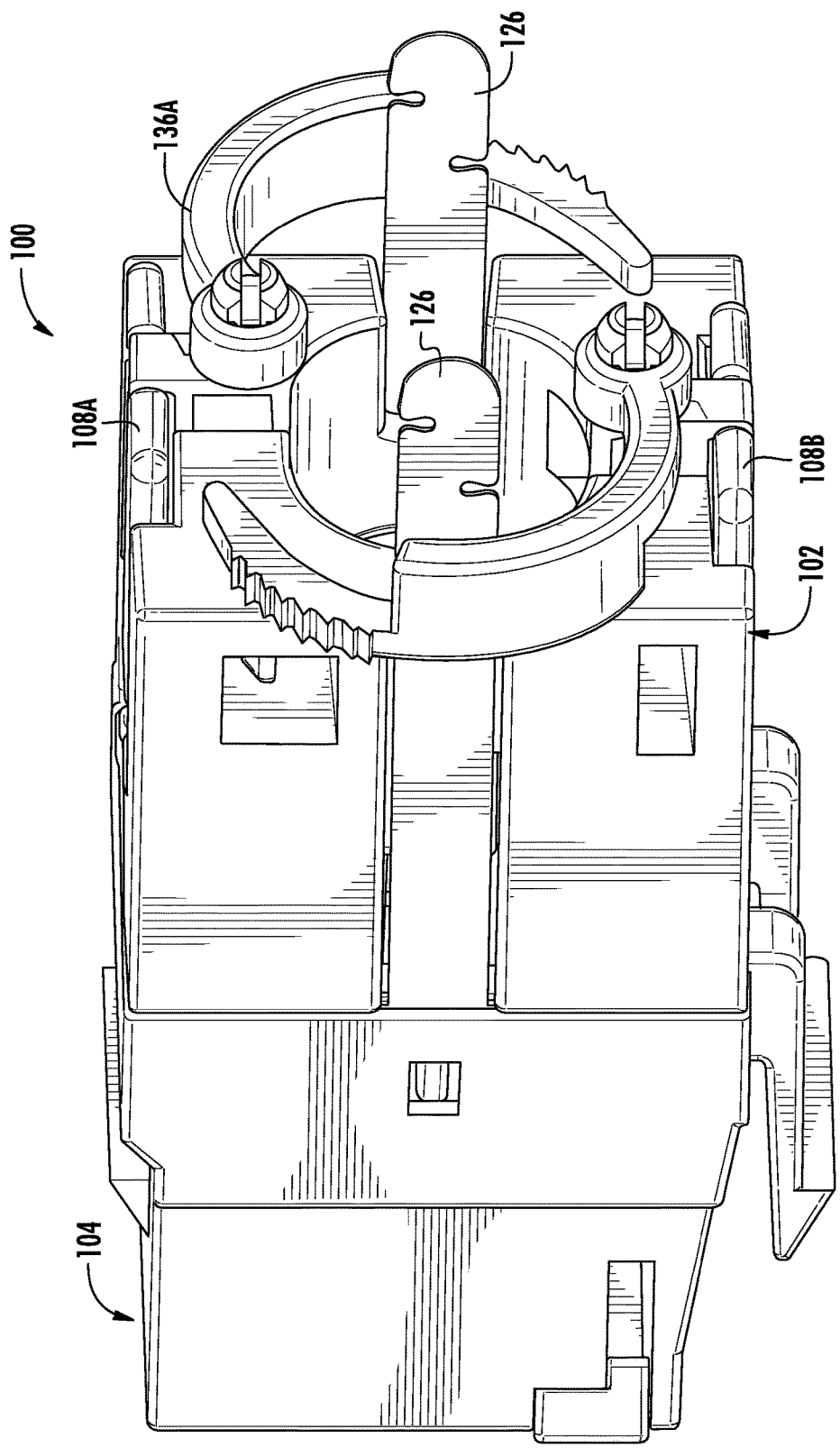
FIG. 32 is a perspective view illustrating the receptacle and cable termination components secured together.
Figure 33:
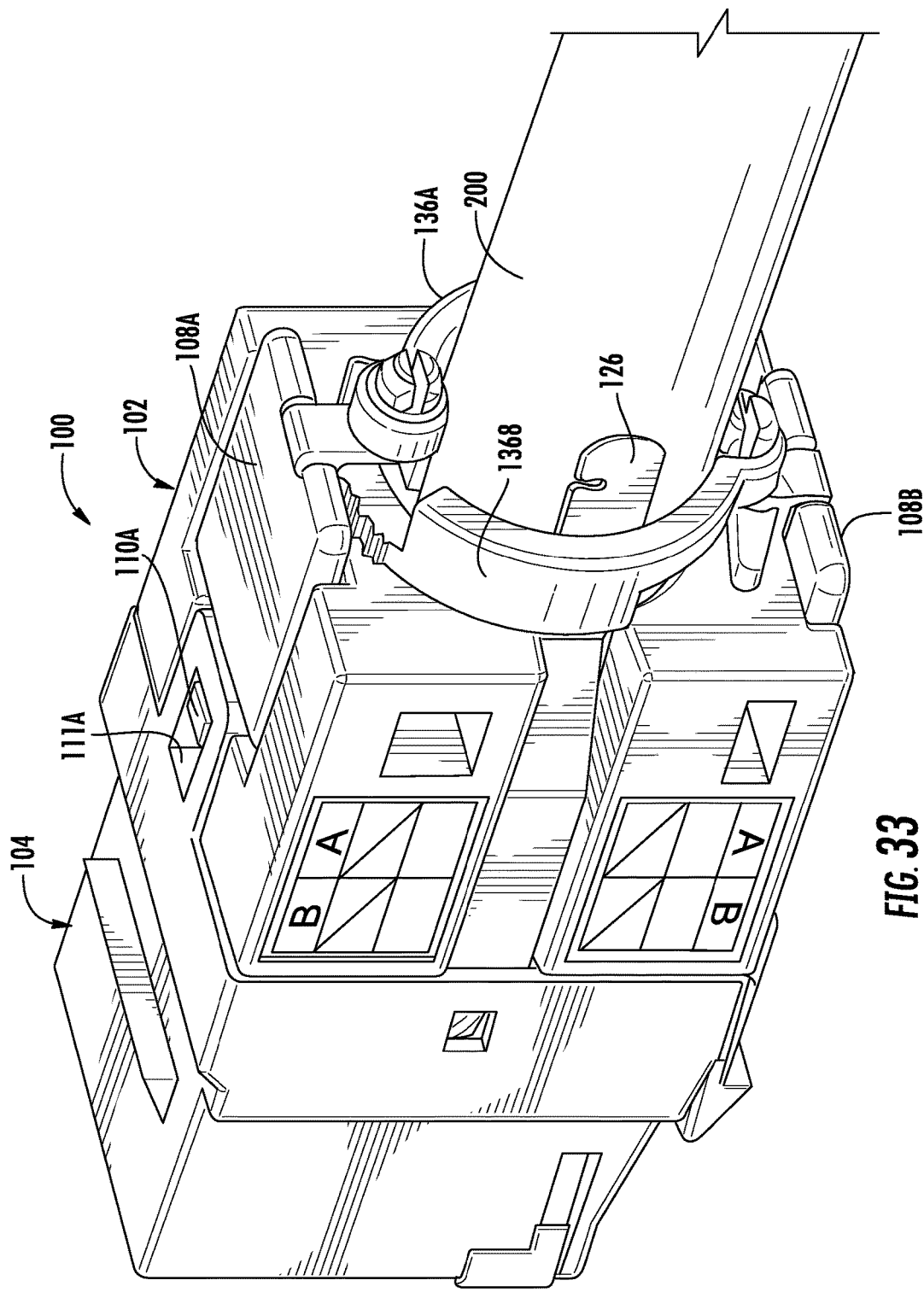
FIG. 33 is a perspective view illustrating a cable entering the cable termination component and pivoting clamps in abutment with the cable.

Referring to FIG. 31, the offset placement of the IDCs 130 minimizes the facing area of an adjacent IDC housing 132 and jack 100 and, therefore, effectively increases the separation between the IDCs 130 of one jack 100 and the IDCs 130 of an adjacent jack 100 for improving signal transmission performance.

Referring to the foregoing description of the preferred embodiments of the invention, it would be apparent that many modifications may be made therein. It is to be understood that all such modifications are embodied in the accompanying claims which come within the true spirit and scope of the invention.

The invention claimed is:

1. A communication connector for improving signal transmission performance, the communication connector comprising:
   a cable termination component having a front end and a rear end, said cable termination component being sized and configured for selective receipt of a plurality of conductor pairs of a cable;
   a plurality of slots on said cable termination component, wherein each wire of each of said plurality of conductor pairs may be selectively pressed into one of said plurality of slots;
   a receptacle component including a plurality of electrical contacts and a plurality of offset-positioned insulation displacement contacts (IDCs), each of said plurality of offset-positioned IDCs being aligned for engaged abutment with a corresponding one of the wires of the plurality of conductor pairs when said cable termination component and said receptacle component are coupled;
   a printed circuit board;
   a first lever arm having a distal end and a proximal end that is pivotally secured to said cable termination component, said proximal end having a hook element that is sized and configured for engaging a corresponding latch element on said receptacle component, and said first lever arm being selectively operable between an open position and a closed position, wherein force exerted by a user on the distal end of said first lever arm when in the open position causes said hook element to engage said corresponding latch element, thereby defining the closed position, and securing said cable termination component to said receptacle component; and
   wherein the offset placement of said IDCs increases the separation distance between IDCs of another receptacle component when a plurality of said receptacle components are adjacent to one another, whereby a signal transmission is improved.

2. The communication connector as recited in claim 1 further comprising a second lever arm having a distal end and a proximal end that is pivotally secured to said cable termination component, said proximal end having a hook element that is sized and configured for engaging a corresponding second latch element on said receptacle component, and said second lever arm being selectively operable between an open position and a closed position, wherein force exerted by a user on the distal end of said second lever arm when in said open position causes said hook element to engage said corresponding second latch element, thereby defining the closed position, and securing said cable termination component to said receptacle component.

3. The communication connector as recited in claim 2 wherein said first and second hook elements are oppositely disposed on said cable termination component.

4. The communication connector as recited in claim 1 further comprising a cable ratcheting assembly on the rear end of said cable termination component, said cable ratcheting assembly including first and second pivoting clamps which may each be selectively pivoted into abutment with the cable in order to relieve stress on the cable at the location the cable meets said cable termination component.

5. The communication connector as recited in claim 1 further comprising an internal cable shield substantially surrounding said plurality of offset-positioned IDCs on said receptacle component and having first and second protrusions extending therefrom, said internal cable shield being formed of conductive materials, said first and second protrusions being sized and configured to extend alongside opposing, outer-facing sides of said cable termination component when said receptacle component is secured to said cable termination component, whereby said first and second protrusions extend adjacently to a portion of the cable.

6. The communication connector as recited in claim 5 wherein said internal cable shield includes at least one notch formed on each of said first and second protrusions, and each of said notches being sized and configured for receipt of a cable drain wire.

7. The communication connector as recited in claim 5 further comprising a non-conductive housing surrounding a cavity and said housing being sized and configured for encasing said receptacle component and at least a portion of said internal cable shield in the cavity.

8. A communication connector for improving signal transmission performance, the communication connector comprising:
   a housing;
   a cable termination component received by said housing, and said cable termination component being sized and configured for selective receipt of a plurality of conductor pairs of a cable;
   a plurality of slots, wherein each wire of each of said plurality of conductor pairs may be selectively pressed into one of said plurality of slots;
   a receptacle component received by said housing including a plurality of electrical contacts and a plurality of offset-positioned insulation displacement contacts (IDCs), each of said plurality of offset-positioned IDCs being aligned for engaged abutment with a corresponding one of the wires of the plurality of conductor pairs when said cable termination component and said receptacle component are coupled;
   a printed circuit board; and
   wherein the offset placement of said IDCs increases the separation distance between IDCs of another receptacle component when a plurality of said receptacle components are adjacent to one another, whereby a signal transmission is improved.

9. The communication connector as recited in claim 8 further comprising a first lever arm having a distal end and a proximal end that is pivotally secured to said cable termination component, said proximal end having a hook element that is sized and configured for engaging a corresponding latch element on said receptacle component, and said first lever arm being selectively operable between an open position and a closed position, wherein force exerted by a user on the distal end of said first lever arm when in the open position causes said hook element to engage said corresponding latch element, thereby defining the closed position, and securing said cable termination component to said receptacle component.

10. The communication connector as recited in claim 8 further comprising a cable ratcheting assembly on the rear end of said cable termination component, said cable ratcheting assembly including first and second pivoting clamps which may each be selectively pivoted into abutment with the cable in order to relieve stress on the cable at the location the cable meets said cable termination component.

11. The communication connector as recited in claim 8 further comprising an internal cable shield substantially surrounding said plurality of offset-positioned IDCs on said receptacle component and having first and second protrusions extending therefrom, said internal cable shield being formed of conductive materials, said first and second protrusions being sized and configured to extend alongside opposing, outer-facing sides of said cable termination component when said receptacle component is secured to said cable termination component, whereby said first and second protrusions extend adjacently to a portion of the cable.

12. The communication connector as recited in claim 11 wherein said internal cable shield includes at least one notch formed on each of said first and second protrusions, and each of said notches being sized and configured for receipt of a cable drain wire.

13. An electrical connectivity system for improving signal transmission performance, the electrical connectivity system comprising:
a plug;
a jack configured for receipt of said plug, said jack comprising:
 a cable termination component having a front end and a rear end, said cable termination component being sized and configured for selective receipt of a plurality of conductor pairs of a cable;
 a plurality of slots on said cable termination component, wherein each wire of each of said plurality of conductor pairs may be selectively pressed into one of said plurality of slots;
 a receptacle component including a plurality of electrical contacts and a plurality of offset-positioned insulation displacement contacts (IDCs) on said receptacle component, each of said plurality of offset-positioned IDCs being aligned for engaged abutment with a corresponding one of the wires of the plurality of conductor pairs when said cable termination component and said receptacle component are coupled;
 a printed circuit board; and
 a first lever arm having a distal end and a proximal end that is pivotally secured to said cable termination component, said proximal end having a hook element that is sized and configured for engaging a corresponding latch element on said receptacle component, and said first lever arm being selectively operable between an open position and a closed position, wherein force exerted by a user on the distal end of said first lever arm when in the open position causes said hook element to engage said corresponding latch element, thereby defining the closed position, and securing said cable termination component to said receptacle component; and
wherein the offset placement of said IDCs increases the separation distance between IDCs of another receptacle component when a plurality of said jacks are adjacent to one another, whereby a signal transmission is improved.

14. The electrical connectivity system as recited in claim 13 wherein said plug comprises:
a housing;
a plurality of pairs of electrical contacts received by the housing and being sized and configured for electrically connecting with said plurality of electrical contacts on said receptacle component; and
a printed circuit board (PCB); the PCB including at least first and second pairs of electrical conductive signal traces; the first pair of traces connected to a first pair of contacts; the second pair of traces connected to a second pair of contacts; the PCB having first and second regions; the first pair of traces located in the first region and the second pair of traces located in the second region; the PCB further including at least a first ground plane; the first ground plane having first and second sections; the first and second sections being substantially electrically isolated from one another; at least a portion of the first section being adjacent to at least a portion of the first pair of traces; at least a portion of the second section being adjacent to at least a portion of the second pair of traces whereby the signal transmission performance is improved.

15. The electrical connectivity system as recited in claim 13 wherein said plug comprises:
a housing;
a plurality of pairs of electrical contacts received by the housing; and
a first printed circuit board (PCB); the PCB including at least first and second pairs of electrically conductive signal traces; the first pair of traces connected to a first pair of contacts; the second pair of traces connected to a second pair of contacts; the PCB having first and second regions; at least one trace of the first pair of traces located in the first region and at least one trace of the second pair of traces located in the second region; the PCB further including at least a first conductive ground plane; the first conductive ground plane having a gap thereby forming first and second sections which are not electrically connected to each other; at least a portion of the first section being adjacent to at least a portion of at least one trace of the first pair; at least a portion of the second section being adjacent to at least a portion of at least one trace of the second pair.

16. The electrical connectivity system as recited in claim 13 wherein said plug comprises:
a housing;
a plurality of pairs of electrical contacts received by the housing; and
a printed circuit board (PCB); the PCB including at least first and second pairs of electrical conductive signal traces; the first pair of signal traces connected to a first pair of contacts and the second pair of signal traces connected to a second pair of contacts; the PCB further including a first ground plane, a layer of relatively high dielectric material, and a layer of relatively low dielectric material supporting high frequency transmissions; the layer of relatively low dielectric material being located between one side of the first ground plane and the first and second pairs of traces; the layer of relatively high dielectric material being adjacent to the other side of the first ground plane.

17. The electrical connectivity system as recited in claim 13 further comprising a second lever arm having a distal end and a proximal end that is pivotally secured to said cable termination component, said proximal end having a hook element that is sized and configured for engaging a corresponding second latch element on said receptacle component, and said second lever arm being selectively operable between an open position and a closed position, wherein force exerted by a user on the distal end of said second lever arm when in said open position causes said hook element to engage said corresponding second latch element, thereby defining the closed position, and securing said cable termination component to said receptacle component.

18. The electrical connectivity system as recited in claim 13 further comprising an internal cable shield substantially surrounding said plurality of offset-positioned IDCs on said receptacle component and having first and second protrusions extending therefrom, said internal cable shield being formed of conductive materials, said first and second protrusions being sized and configured to extend alongside opposing, outer-facing sides of said cable termination component when said receptacle component is secured to said cable termination component, whereby said first and second protrusions extend adjacently to a portion of the cable.

19. The electrical connectivity system as recited in claim 18 wherein said internal cable shield includes at least one notch formed on each of said first and second protrusions, and each of said notches being sized and configured for receipt of a cable drain wire.

20. The electrical connectivity system as recited in claim 18 further comprising a non-conductive housing surrounding a cavity and said housing being sized and configured for encasing said receptacle component and at least a portion of said internal cable shield in the cavity.

\* \* \* \* \*